(12) United States Patent
Tomizawa et al.

(10) Patent No.: US 9,202,992 B2
(45) Date of Patent: Dec. 1, 2015

(54) SEMICONDUCTOR LIGHT EMITTING DEVICE HAVING A FLUORESCENT SUBSTANCE LAYER

(71) Applicant: Kabushiki Kaisha Toshiba, Minato-ku (JP)

(72) Inventors: Hideyuki Tomizawa, Kanazawa (JP); Akihiro Kojima, Nonoichi (JP); Miyoko Shimada, Hakusan (JP); Yosuke Akimoto, Nonoichi (JP); Hideto Furuyama, Yokohama (JP); Yoshiaki Sugizaki, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/338,684

(22) Filed: Jul. 23, 2014

(65) Prior Publication Data
US 2015/0263242 A1    Sep. 17, 2015

(30) Foreign Application Priority Data
Mar. 11, 2014    (JP) .................................. 2014-047448

(51) Int. Cl.
*H01L 31/02*    (2006.01)
*H01L 33/42*    (2010.01)
*H01L 51/52*    (2006.01)
(Continued)

(52) U.S. Cl.
CPC .......... *H01L 33/502* (2013.01); *H01L 33/0008* (2013.01); *H01L 33/10* (2013.01); *H01L 33/46* (2013.01); *H01L 31/02322* (2013.01); *H01L 33/42* (2013.01); *H01L 51/5234* (2013.01)

(58) Field of Classification Search
CPC ... H01L 31/02322; H01L 33/42; H01L 33/46; H01L 51/5234
See application file for complete search history.

(56) References Cited

U.S. PATENT DOCUMENTS 7,692,259 B2 *  4/2010  Suehiro .......................... 257/431
8,471,283 B2    6/2013  Ishii et al.
(Continued)

FOREIGN PATENT DOCUMENTS

EP    2 393 133 A1    12/2011
EP    2 642 534 A2     9/2013
(Continued)

OTHER PUBLICATIONS

Extended European Search Report mailed Jul. 29, 2015 in European Application No. 14178158.3.

*Primary Examiner* — Ida M Soward
(74) *Attorney, Agent, or Firm* — Oblon, McClelland, Maier & Neustadt, L.L.P.

(57) ABSTRACT

A semiconductor light emitting device includes a semiconductor layer, a p-side and an n-side interconnect portions, a fluorescent substance layer and a transparent layer. The semiconductor layer has a first major surface, a second major surface, and a first side surface, the semiconductor layer including a light emitting layer. The p-side and n-side interconnect portions are electrically connected to the semiconductor layer. The fluorescent substance layer is provided on the first major surface side. The transparent layer is provided between the semiconductor layer and the fluorescent substance layer, and has a second side surface. The device further includes an insulating film covering the first side surface and the second side surface, and a reflecting member covering the first side surface and the second side surface via the insulating film.

20 Claims, 21 Drawing Sheets

(51) Int. Cl.
  *H01L 33/50* (2010.01)
  *H01L 33/46* (2010.01)
  *H01L 33/10* (2010.01)
  *H01L 33/00* (2010.01)
  *H01L 31/0232* (2014.01)

(56) References Cited

U.S. PATENT DOCUMENTS

| | | | |
|---|---|---|---|
| 8,643,029 B2* | 2/2014 | Lee et al. | 257/88 |
| 8,669,698 B2* | 3/2014 | Shimada et al. | 313/501 |
| 8,754,429 B2* | 6/2014 | Koizumi et al. | 257/98 |
| 8,981,412 B2* | 3/2015 | Koizumi et al. | 257/98 |
| 2004/0079955 A1* | 4/2004 | Furukawa et al. | 257/98 |
| 2005/0056855 A1* | 3/2005 | Lin et al. | 257/98 |
| 2009/0001407 A1* | 1/2009 | Osawa et al. | 257/99 |
| 2009/0159902 A1* | 6/2009 | Yasuda et al. | 257/88 |
| 2010/0148198 A1 | 6/2010 | Sugizaki et al. | |
| 2011/0073889 A1* | 3/2011 | Sugizaki et al. | 257/98 |
| 2011/0297997 A1* | 12/2011 | Izuka et al. | 257/99 |
| 2011/0309398 A1 | 12/2011 | Ito et al. | |
| 2012/0097972 A1 | 4/2012 | Sugizaki et al. | |
| 2013/0154478 A1* | 6/2013 | Ohe et al. | 315/85 |
| 2013/0285089 A1* | 10/2013 | Akimoto et al. | 257/98 |
| 2013/0285091 A1* | 10/2013 | Akimoto et al. | 257/98 |
| 2013/0313591 A1* | 11/2013 | Shimada et al. | 257/98 |

FOREIGN PATENT DOCUMENTS

| | | |
|---|---|---|
| EP | 2 667 423 A1 | 11/2013 |
| JP | 2013-110199 | 6/2013 |
| JP | 2013-143430 | 7/2013 |
| WO | WO 2013/005646 A1 | 1/2013 |
| WO | WO 2013/137356 A1 | 9/2013 |

* cited by examiner

SEMICONDUCTOR LIGHT EMITTING DEVICE HAVING A FLUORESCENT SUBSTANCE LAYER

CROSS-REFERENCE TO RELATED APPLICATIONS

This application is based upon and claims the benefit of priority from Japanese Patent Application No. 2014-047448, filed on Mar. 11, 2014; the entire contents of which are incorporated herein by reference.

FIELD

Embodiments are related generally to a semiconductor light emitting device.

BACKGROUND

Semiconductor light emitting devices having a chip-size package structure have been developed, using a light emitting diode (LED) combined with a fluorescent substance. The semiconductor light emitting devices can radiate visible light such as white light or light in other wavelength band, and be used for various applications. In such devices, however, there is a room for improvement in light characteristics, for example, light output power or emission color.

DETAILED DESCRIPTION

Figure 1:
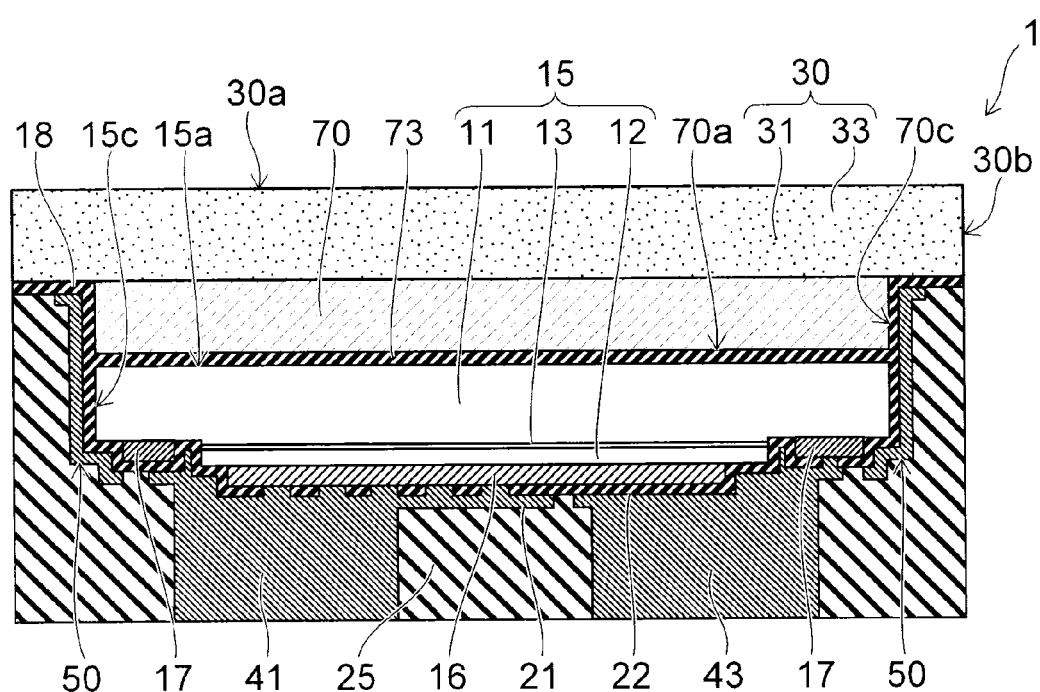
FIG. 1 is a schematic cross-sectional view showing an example of a semiconductor light emitting device according to a first embodiment.

According to an embodiment, a semiconductor light emitting device includes a semiconductor layer, a p-side interconnect portion, an n-side interconnect portion, a fluorescent substance layer and a transparent layer. The semiconductor layer has a first major surface, a second major surface on a side opposite to the first major surface, and a first side surface being in contact with the first major surface and the second major surface, the semiconductor layer including a light emitting layer. The p-side interconnect portion is electrically connected to the semiconductor layer on the second major surface side, and the n-side interconnect portion is electrically connected to the semiconductor layer on the second major surface side. The fluorescent substance layer is provided on the first major surface side, and includes a fluorescent substance radiating light different in a wavelength from light emitted from the light emitting layer. The transparent layer is provided between the semiconductor layer and the fluorescent substance layer, and has a third major surface on the semiconductor layer side, a fourth major surface on the fluorescent substance layer side, and a second side surface being in contact with the third major surface, the transparent layer transmitting the light emitted from the light emitting layer.

The device further includes an insulating film covering the first side surface and the second side surface, and a reflecting member covering the first side surface and the second side surface via the insulating film.

Hereinafter, embodiments of the invention will be described with reference to the drawings. In the drawings, the same portions are denoted by the same reference numerals, detailed description thereof is appropriately omitted, and portions different therefrom are described. Incidentally, the drawings are illustrated schematically or conceptually, and a relation between thickness and width of each portion, a ratio of sizes between the portions, and the like may not be necessarily the same as those of the actual cases. In addition, even in a case where the same portion is shown, the dimension or ratio thereof may be different according to the drawings.

First Embodiment

FIG. 1 is a schematic cross-sectional view illustrating a semiconductor light emitting device 1 according to a first embodiment.

Figure 2A:
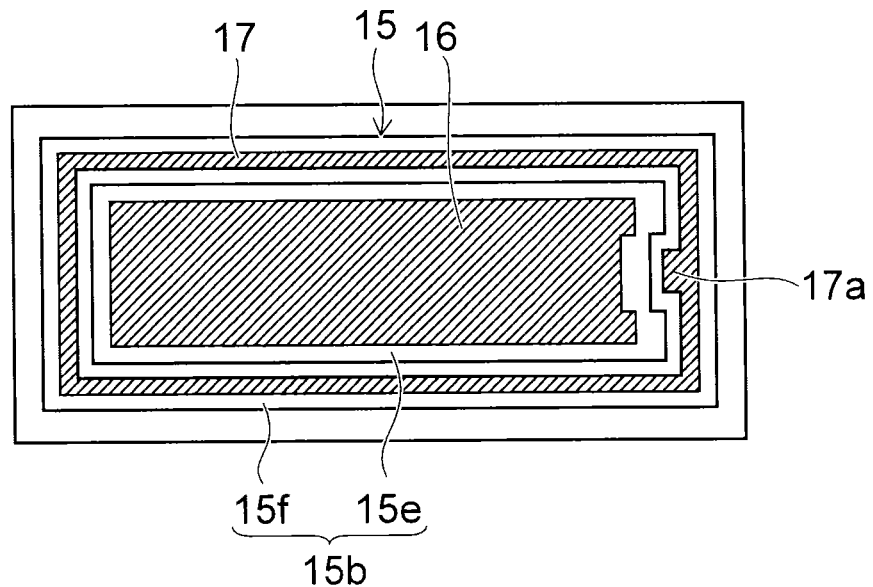
FIGS. 2A and 2B are schematic plan views showing an example of the semiconductor light emitting device according to the first embodiment.
Figure 2B:
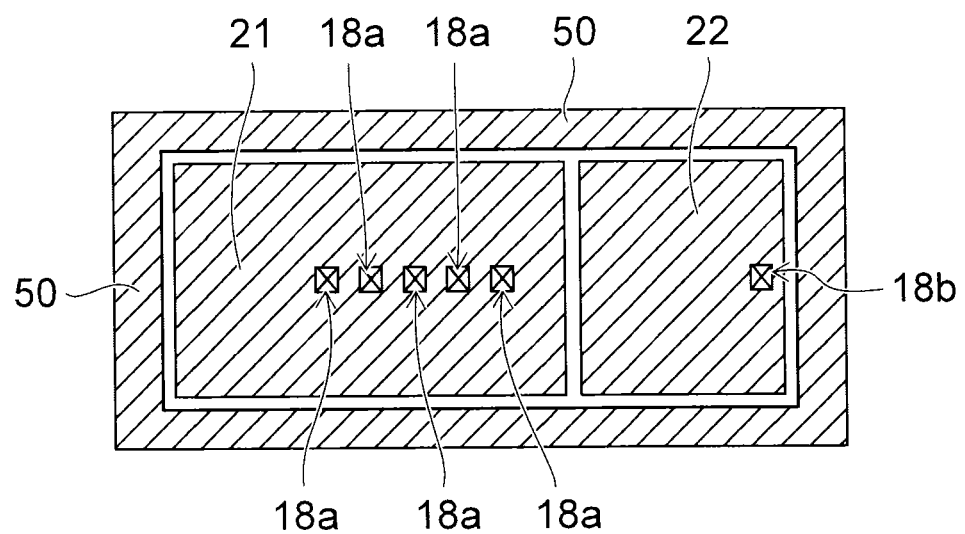

FIGS. 2A and 2B are schematic plan views illustrating the semiconductor light emitting device 1 according to the first embodiment.

The semiconductor light emitting device 1 includes a semiconductor layer 15, a p-side interconnect portion 41, an n-side interconnect portion 43 and a fluorescent substance layer 30. The p-side interconnect portion 41 and the n-side interconnect portion 43 are electrically connected to the semiconductor layer 15.

The semiconductor layer 15 has a first major surface 15a, a second major surface 15b (refer to FIG. 3A) at the opposite side of the first major surface 15a, and a first side surface (hereinafter, referred to as a side surface 15c). The first side surface is in contact with the first major surface 15a and the second major surface 15b. The semiconductor layer 15 includes an n-type semiconductor layer 11, a p-type semiconductor layer 12, and a light emitting layer 13. The light emitting layer 13 is provided between the n-type semiconductor layer 11 and the p-type semiconductor layer 12.

The p-side interconnect portion 41 and the n-side interconnect portion 43 are electrically connected to the semiconductor layer 15 on the side of the second major surface 15b. The p-side interconnect portion 41 is electrically connected to a p-side electrode 16 which is in contact with the p-type semiconductor layer 12. The n-side interconnect portion 43 is electrically connected to an n-side electrode 17 which is in contact with the n-type semiconductor layer 11.

A resin layer 25 is provided between the p-side interconnect portion 41 and the n-side interconnect portion 43. The p-side interconnect portion 41, the n-side interconnect portion 43, and the resin layer 25 constitute a support body which supports the semiconductor layer 15.

The fluorescent substance layer 30 is provided on the side of the first major surface 15a of the semiconductor layer 15. The fluorescent substance layer 30 includes a fluorescent substance 31. The fluorescent substance 31 is excited by the radiation light of the light emitting layer and radiates light having a wavelength different from that of the radiation light.

In the embodiment, a transparent layer 70 is provided between the semiconductor layer 15 and the fluorescent substance layer 30. The radiation light of the light emitting layer 13 propagates through the transparent layer. Herein, the term "transparent" is not limited to the case where 100% of the radiation light propagates through the transparent layer 70, but it may also include a case where a portion of the radiation light is absorbed.

The transparent layer 70 has a third major surface 70a on the side of the semiconductor layer 15. The third major surface 70a is provided to be parallel to the first major surface 15a. The transparent layer 70 has a second side surface (hereinafter, referred to as a side surface 70c) which is in contact with the third major surface 70a.

The semiconductor light emitting device 1 includes an insulating film 18 and a metal film 50. The insulating film 18 covers the side surface 15c and the side surface 70c, and the metal film 50 covers the side surface 15c and the side surface 70c via the insulating film 18. The metal film 50 includes a reflecting member which reflects the radiation light of the light emitting layer 13. In the description hereinafter, the term "cover" means not only a case where "something to cover" is in direct contact with "something to be covered", but also a case where "something to cover" is provided on "something to be covered" with another element being interposed.

FIG. 2A is a schematic plan view showing the second major surface 15b of the semiconductor layer 15, wherein the p-side interconnect portion 41, the n-side interconnect portion 43, the resin layer 25, and the insulating film 18 are removed for exposing the second major surface 15b.

The second major surface 15b of the semiconductor layer 15 has a portion including the light emitting layer 13 (herein after emitting region 15e), and a portion including no light emitting layer 13 (herein after non-emitting region 15f). The p-side electrode 16 is formed on the emitting region 15e. The n-side electrode 17 is formed on the non-emitting region 15f.

As shown in FIG. 2A, the non-emitting region 15f is provided to surround, for example, the emitting region 15e. In addition, the n-side electrode 17 may be provided to surround, for example, the p-side electrode 16. FIGS. 2A and 2B illustrate an example of planar arrangement of the p-side electrode 16 and the n-side electrode 17, but the embodiment is not limited thereto.

FIG. 2B is a schematic plan view showing a p-side interconnect layer 21, an n-side interconnect layer 22, and the metal film 50 which are provided on the side of the second major surface 15b of the semiconductor layer 15.

The p-side interconnect layer 21, the n-side interconnect layer 22, and the metal film 50 are provided on the insulating film 18 which covers the semiconductor layer 15, the p-side electrode 16, and the n-side electrode 17. The p-side interconnect layer 21 is electrically connected to the p-side electrode 16 through openings 18a provided in the insulating film 18.

The area of the emitting region 15e is provided to be larger than the area of the non-emitting region 15f so that light output power is improved. A plurality of the openings 18a communicating with the p-side electrode 16 are provided in the insulating film 18 so that the current may uniformly flows into the emitting region 15e. The embodiment is not limited to the example. For example, the p-side interconnect layer 21 may be connected to the p-side electrode 16 through one opening which has a larger area than that of the opening 18a shown in FIG. 2B.

The n-side interconnect layer 22 is electrically connected to the n-side electrode 17 through opening 18b provided in the insulating film 18.

For example, the p-side electrode 16, the n-side electrode 17, the p-side interconnect layer 21, the n-side interconnect layer 22, and the metal film 50 may preferably include a member which reflects the radiation light of the light emitting layer 13, since they are provided on the side of the second major surface 15b of the semiconductor layer 15.

In the semiconductor light emitting device 1, the light emitting layer 13 emits light generated by supplying current to the light emitting layer 13 through the p-side electrode 16 and the n-side electrode 17. The light radiated from the light emitting layer 13 is extracted from the side of the first major surface 15a to the outside of the semiconductor layer 15. Thus, if the p-side electrode 16, the n-side electrode 17, the p-side interconnect layer 21, the n-side interconnect layer 22, and the metal film 50, which are provided at the side of the second major surface 15b, can preferably act as a reflecting layer, improving the intensity of the light emitted from the side of the first major surface 15a of the semiconductor layer 15.

The fluorescent substance layer 30 is provided on the first major surface 15a of the semiconductor layer 15. The fluorescent substance layer 30 includes the fluorescent substance 31. The fluorescent substance 31 absorbs part of the light emitted from the light emitting layer 13 and radiates light having a wavelength different from that of the light emitted from the light emitting layer 13. In other words, the fluorescent substance 31 has an emission spectrum different from the emission spectrum of the light emitting layer 13. The fluorescent substance 31 is combined with a binder 33. The binder 33 is, for example, a resin which transmits the light emitted from the light emitting layer 13 and the light radiated from the fluorescent substance 31.

The semiconductor light emitting device 1 emits light from a light emitting surface 30a of the fluorescent substance layer 30, which includes the light emitted from the light emitting layer 13 and the light radiated from the fluorescent substance 31. Moreover, it is possible to change emission color by adjusting a type and content of the fluorescent substance 31. The fluorescent substance 31 is not limited to one type of a fluorescent substance, but the fluorescent substance layer 30 may include plural types of fluorescent substances.

The transparent layer 70 is provided between the semiconductor layer 15 and the fluorescent substance layer 30. The light extracted from the semiconductor layer 15 propagates through the transparent layer 70, and enters the fluorescent substance layer 30. The transparent layer 70 is preferably formed to have high transmittance against the light that is directed from the semiconductor layer 15 toward the fluorescent substance layer 30, and high reflectance against the light that is directed from the fluorescent substance layer 30 toward the semiconductor layer 15.

For example, when the refractive index of the transparent layer 70 is set to be smaller than the refractive index of the fluorescent substance layer 30, the light radiated from the fluorescent substance 31 may be reflected at the interface between the fluorescent substance layer 30 and the transparent layer 70. In addition, the light may be suppressed, which is reflected at the light emitting surface 30a of the fluorescent substance layer 30, and returns to the semiconductor layer 15. Thus, the light output power of the semiconductor light emitting device 1 may increase by reducing light absorption in the semiconductor layer 15.

A transparent resin can be used for the transparent layer 70. For example, it may be possible for the transparent layer 70 to use the same resin as the binder 33 of the fluorescent substance layer 30. The refractive index of the fluorescent substance layer 30 including the fluorescent substance 31 becomes higher than the refractive index of the transparent layer 70 not including the fluorescent substance. According, the light directed from the fluorescent substance layer 30 toward the semiconductor layer 15 is reflected at the interface between the fluorescent substance layer 30 and the transparent layer 70, and the light output power may be improved in the semiconductor light emitting device 1.

In a case where a resin is used for the transparent layer 70, it is desirable to provide an adhesive layer 73 between the semiconductor layer 15 and the transparent layer 70. For example, an inorganic film such as a silicon oxide film or a silicon nitride film may be used for the adhesive layer 73.

In the embodiment, the metal film 50 covers the side surface 70c of the transparent layer 70. The metal film 50 reflects the light propagating in the lateral direction (the direction parallel to the first major surface 15a) among the lights radiated from the light emitting layer 13. Thus, the light radiated from the side surface is reduced in the semiconductor light emitting device 1, and the variation of emission color, so-called color breakup or color unevenness is suppressed in the lateral direction.

Next, a method of manufacturing the semiconductor light emitting device 1 will be described with reference to FIGS. 3A to 11B.

Figure 3A:
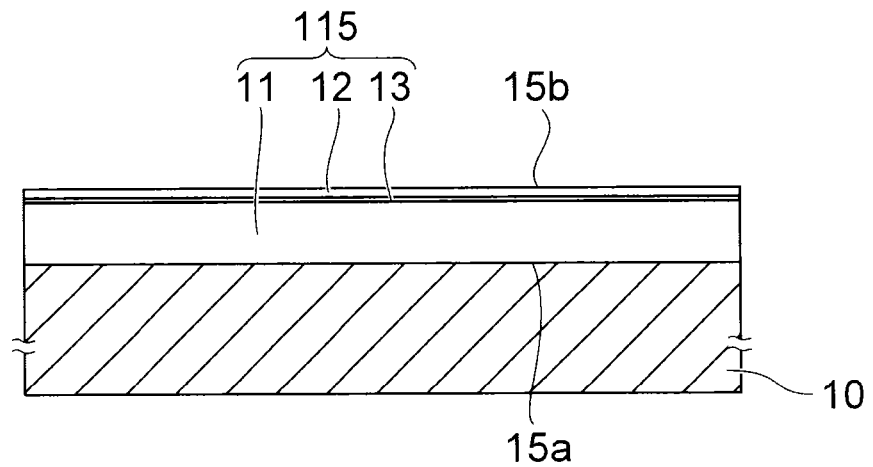
FIGS. 3A to 11B are schematic cross-sectional views showing an example of a manufacturing process of the semiconductor light emitting device according to the first embodiment.

FIG. 3A is a cross-sectional view showing a semiconductor layer 115 formed on a substrate 10. The n-type semiconductor layer 11, the light emitting layer 13, and the p-type semiconductor layer 12 are epitaxially grown in this order on the substrate 10, for example, using a metal organic chemical vapor deposition (MOCVD) method. A surface on the substrate 10 side of the semiconductor layer 15 is the first major surface 15a, and a surface opposite to the first major surface 15a is the second major surface 15b.

The substrate 10 is, for example, a silicon substrate. The semiconductor layer 115 is, for example, a nitride semiconductor layer, and includes gallium nitride (GaN) or the like.

The n-type semiconductor layer 11 may include, for example, a buffer layer provided on the major surface of the substrate 10 and an n-type GaN layer provided on the buffer layer. The p-type semiconductor layer 12 may include, for example, a p-type AlGaN layer provided on the light emitting layer 13 and a p-type GaN layer provided on the p-type AlGaN layer. The light emitting layer 13 has, for example, a multiple quantum well (MQW) structure. The light emitting layer 13 may include a material which emits light such as blue, violet, blue violet or ultraviolet light. In the emission spectrum of the light emitting layer 13, the peak wavelength is, for example, in a range of 430 nm to 470 nm.

Figure 3B:
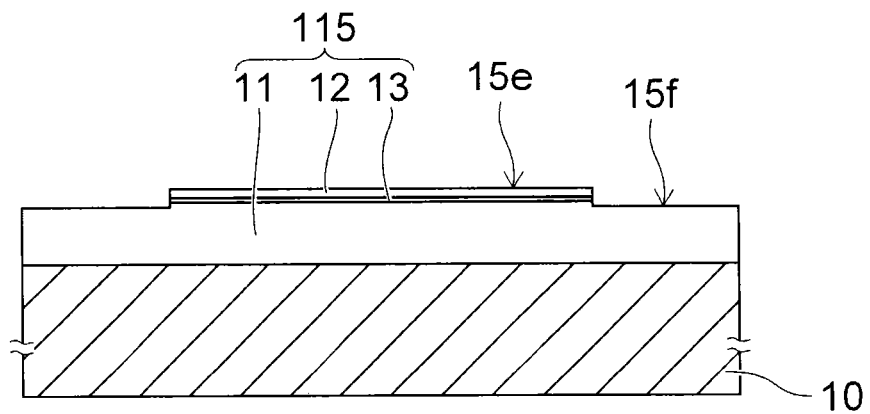

In FIG. 3B, the p-type semiconductor layer 12 and the light emitting layer 13 are selectively removed, and a portion of the n-type semiconductor layer 11 is exposed. For example, the p-type semiconductor layer 12 and the light emitting layer 13 are selectively etched by using a reactive ion etching (RIE) method, thus exposing the portion of the n-type semiconductor layer 11. Thereby, the emitting region 15e including the light emitting layer 13 and the non-emitting region 15f not including the light emitting layer 13 are formed on the second major surface 15b side.

Figure 4A:
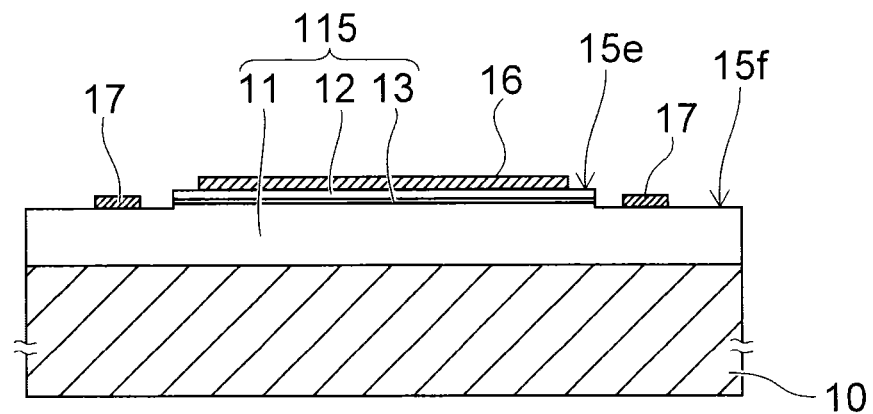

As shown in FIG. 4A, the p-side electrode 16 is formed on the emitting region 15e, and the n-side electrode 17 is formed on the non-emitting region 15f. The p-side electrode 16 is in contact with the surface of the p-type semiconductor layer 12. The n-side electrode 17 is in contact with the surface of the n-type semiconductor layer 11, which is exposed by selectively removing the p-type semiconductor layer 12 and the light emitting layer 13.

The p-side electrode 16 and the n-side electrode 17 are formed by using, for example, a sputtering method, an evaporation method, or the like. Either p-side electrode 16 or the n-side electrode 17 may be formed ahead of the other, or may be formed simultaneously using the same material.

The p-side electrode 16 formed on the emitting area 15e includes a reflecting film which reflects the light emitted from the light emitting layer 13. The p-side electrode 16 includes, for example, silver, a silver alloy, aluminum, an aluminum alloy, or the like. In addition, the p-side electrode 16 may include a metal protective film (i.e. a barrier metal) for suppressing sulfuration or oxidation thereof.

Figure 4B:
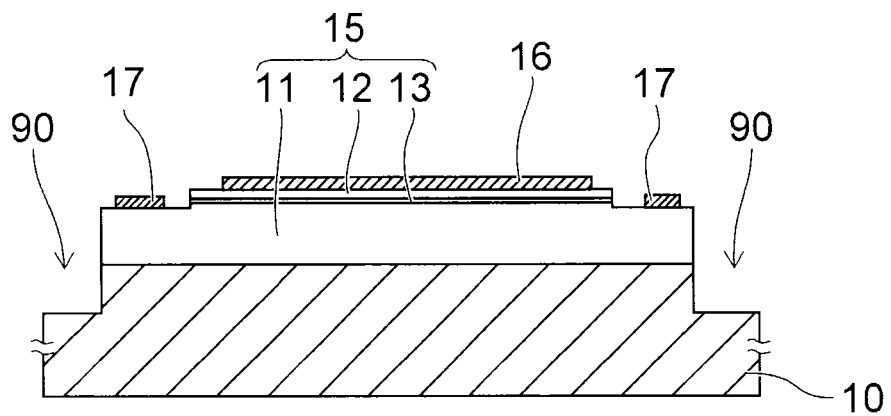

As shown in FIG. 4B, the n-type semiconductor layer 11 is selectively removed to form a trench 90. The semiconductor layer 115 is divided into a plurality of the semiconductor layers 15 by the trench 90. The trench 90 is etched into the semiconductor layer 115 and reaches the substrate 10. In the embodiment, the substrate 10 is also etched to be recessed downward, so that a bottom of the trench 90 locates at a position lower than the interface between the substrate 10 and the semiconductor layer 15. The etching depth is set in the substrate 10 to be several micrometers or several tens micrometers, for example.

Figure 5A:
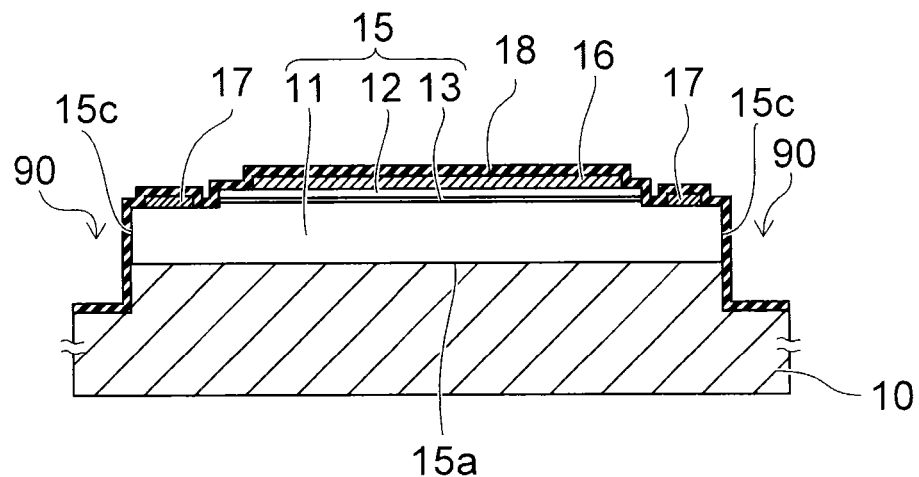

Next, as shown in FIG. 5A, the insulating film 18 is formed to cover a structure on the substrate 10, including the semiconductor layer 15. The insulating film 18 is, for example, a silicon oxide film or a silicon nitride film formed using a chemical vapor deposition (CVD) method.

The insulating film 18 covers the second major surface 15b of the semiconductor layer 15, the p-side electrode 16, and the n-side electrode 17. In addition, the insulating film 18 covers the side surface 15c which is contiguous to the second major surface 15b of the semiconductor layer 15. The insulating film 18 covers the entire inner surface of the trench 90. The insulating film 18 is also formed on the surface of the substrate 10 which is exposed at the bottom of the trench 90.

Subsequently, the openings 18a and the opening 18b are formed in the insulating film 18. The openings 18a communicate with the p-side electrode 16, and the opening 18b communicates with the n-side electrode 17.

Figure 5B:
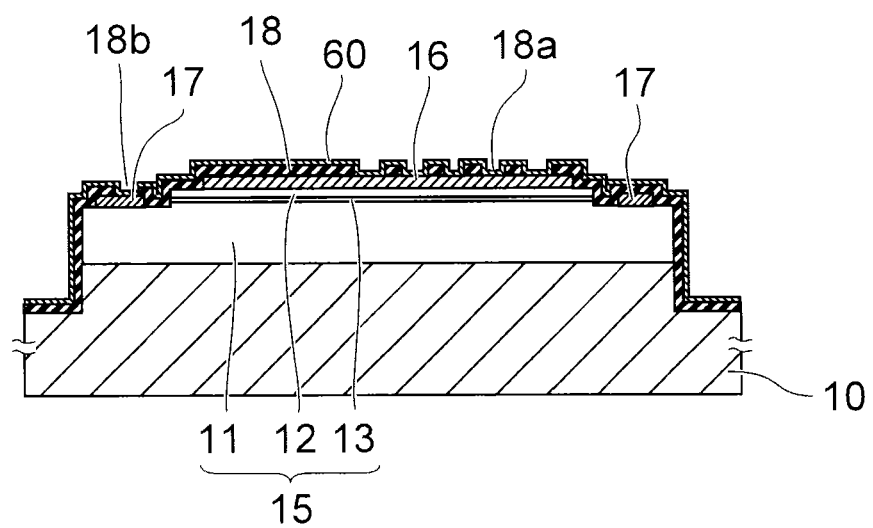

Next, as shown in FIG. 5B, an underlying metal film 60 is formed, which covers the insulating film 18, the inner surface (the sidewalls and the bottom surface) of each opening 18a and the inner surface (the sidewalls and bottom surface) of the opening 18b.

Figure 6A:
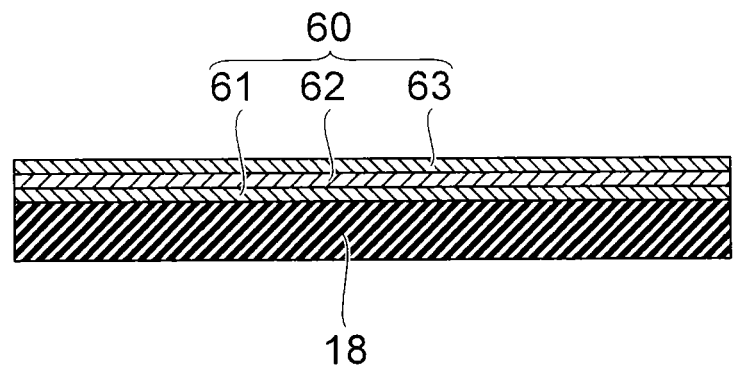

As shown in FIG. 6A, the underlying metal film 60 has a structure, wherein an aluminum film 61, a titanium film 62, and a copper film 63 are sequentially stacked on the insulating film 18. The underlying metal film 60 is formed, for example, using a sputtering method. The aluminum film 61 reflects the radiation light of the light emitting layer 13.

Figure 6B:
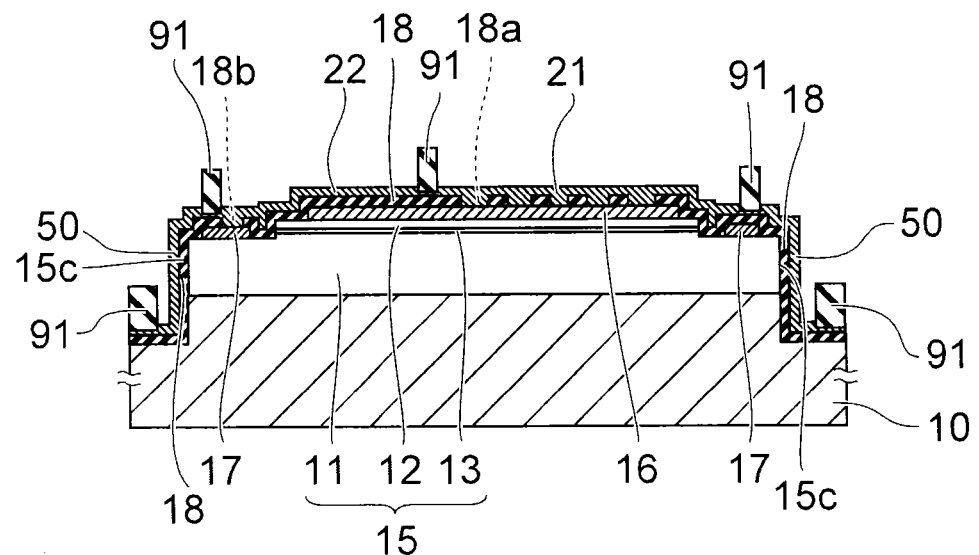

Next, as shown in FIG. 6B, the p-side interconnect layer 21, the n-side interconnect layer 22, and the metal film 50 are formed. The p-side interconnect layer 21, the n-side interconnect layer 22, and the metal film 50 are formed, for example, by selective copper plating using a resist mask 91 formed on the underlying metal film 60. The underlying metal film 60 serves as a seed layer, which conducts current, and the p-side interconnect layer 21, the n-side interconnect layer 22, and the metal film 50 are selectively formed on the copper film 63 of the underlying metal film 60. The p-side interconnect layer 21 is electrically connected to the p-side electrode 16 through the openings 18a. The n-side interconnect layer 22 is electrically connected to the n-side electrode 17 through the opening 18b.

Figure 7A:
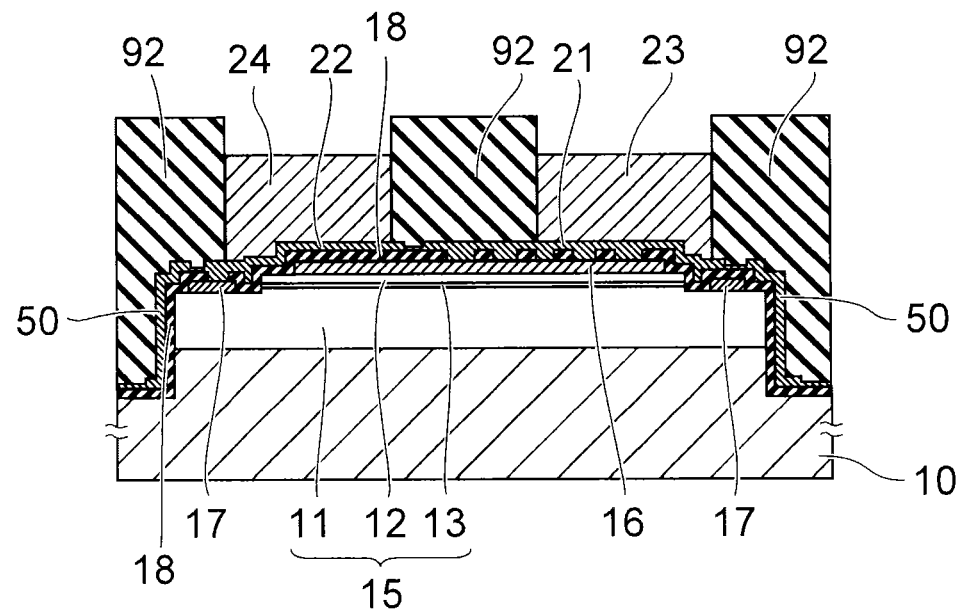

Next, the resist mask 91 is removed, for example, using a solvent or oxygen plasma, and after that, as shown in FIG. 7A, a resist mask 92 is formed. In addition, a p-side metal pillar 23 and an n-side metal pillar 24 are formed on the p-side interconnect layer 21 and the n-side interconnect layer 22, respectively.

The p-side metal pillar 23 and the n-side metal pillar 24 are formed, for example, by selective copper plating. The p-side metal pillar 23 is formed on the p-side interconnect layer 21. The p-side metal pillar 23 may join the p-side interconnect layer 21 to be one body, when being made of the same copper material. The n-side metal pillar 24 is formed on the n-side interconnect layer 22. The n-side metal pillar 24 may join the n-side interconnect layer 22 to be one body, when being made of the same copper material. The resist mask 92 covers the metal film 50. Therefore, either metal pillar is not provided on the metal film 50.

Subsequently, the resist mask 92 is removed using a solvent or oxygen plasma, for example. At this time, the p-side interconnect layer 21 and the n-side interconnect layer are electrically connected to each other through the underlying metal film 60. In addition, the p-side interconnect layer 21 and the metal film 50 are also electrically connected to each other through the underlying metal film 60, and the n-side interconnect layer 22 and the metal film 50 are also electrically connected to each other through the underlying metal film 60.

In the following process, the underlying metal film 60 are selectively removed by etching between the p-side interconnect layer 21 and the n-side interconnect layer 22, between the p-side interconnect layer 21 and the metal film 50, and between the n-side interconnect layer 22 and the metal film 50. Accordingly, the electrical connections are vanished between the p-side interconnect layer 21 and the n-side interconnect layer 22, between the p-side interconnect layer 21 and the metal film 50, and between the n-side interconnect layer 22 and the metal film 50.

Figure 7B:
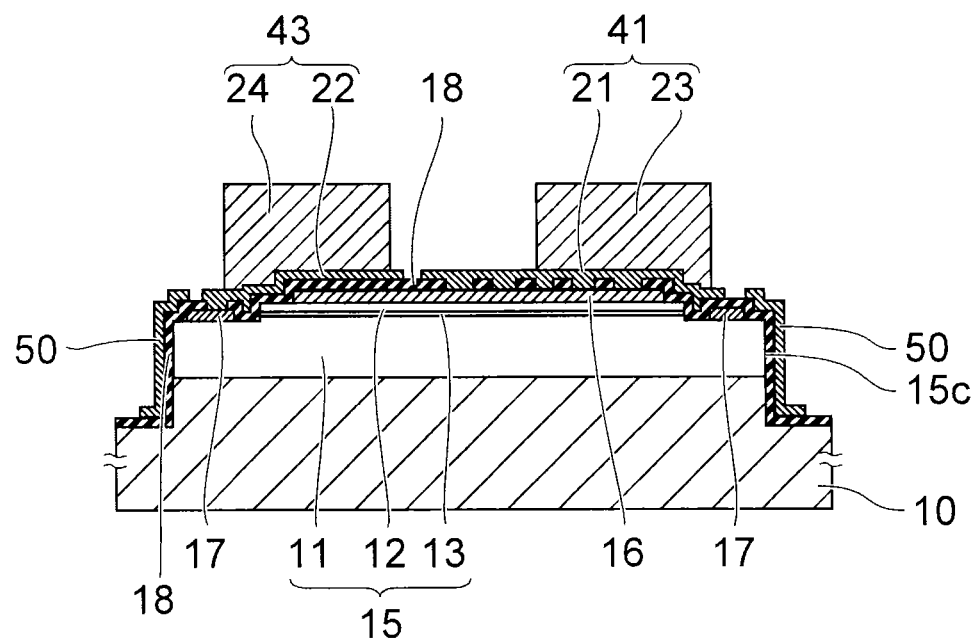

As shown in FIG. 7B, the p-side interconnect portion 41, the n-side interconnect portion 43, and the metal film 50 are formed on the side of the second major surface of the semiconductor layer 15. The p-side interconnect portion 41 includes the p-side interconnect layer 21 and the p-side metal pillar 23. The n-side interconnect portion 43 includes the n-side interconnect layer 22 and the n-side metal pillar 24.

The metal film 50 formed around the side surface 15c of the semiconductor layer 15 is in an electrically floating state and does not act as an electrode. The metal film 50 includes the aluminum film 61 of the underlying metal film 60 and acts as a reflecting film.

In addition, in the process shown in FIG. 5B, a plating film may not be formed on the side surface 15c of the semiconductor layer 15. In other words, the metal film 50 may be a portion of the underlying metal film 60 without the plating layer. For example, if the resist mask 91 is formed to cover the side surface 15c of the semiconductor layer 15, any plating film is not formed on the underlying metal film 60.

In the case of using the underlying metal film 60 as the metal film 50, the underlying metal film 60 is etched to leave a portion which is to be the metal film 50, when disconnecting the electrical connection between the p-side interconnect layer 21 and the n-side interconnect layer 22. In other words, if the portion which is to be the metal film 50 is covered with a resist film, the underlying metal film 60 remains on the insulating film 18, forming the metal film 50.

In this manner, forming the metal film 50 to be a thin film makes the dicing process of the semiconductor light emitting device 1 easier. In addition, it may be possible to suppress damages in the diced side surface, and to improve reliability of the semiconductor light emitting device 1.

Figure 8A:
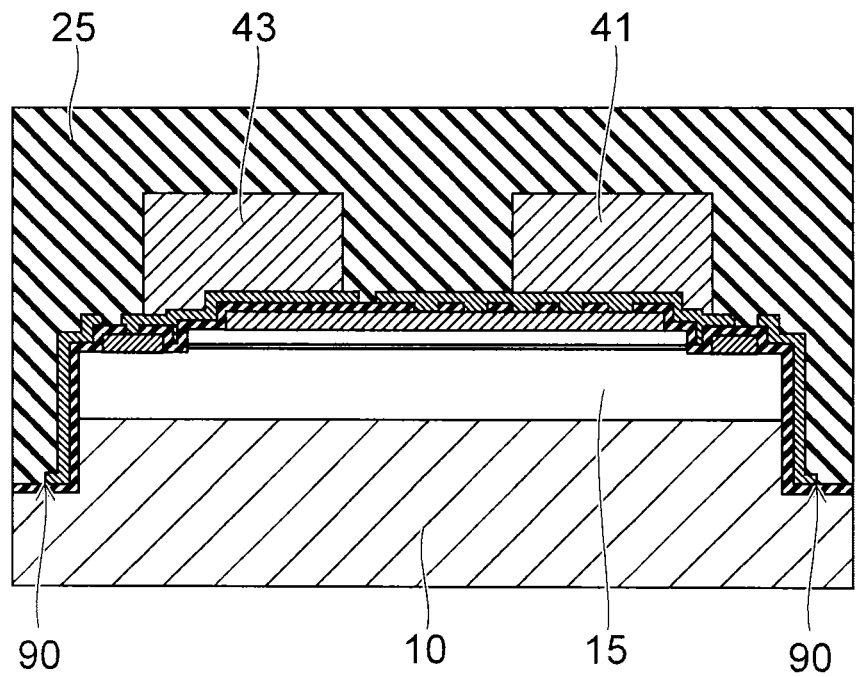

Next, as shown in FIG. 8A, the resin layer 25 is formed to cover the p-side interconnect portion 41 and the n-side interconnect portion 43 and to embed the trench 90. The resin layer 25 covers the metal film 50 inside the trench 90. For example, an epoxy resin, a silicon resin, a fluorine resin, or the like can be used for the resin layer 25. For example, a black resin containing a light-shielding material such as carbon particles may be used for the resin layer 25. Accordingly, light leakage is reduced on the second major surface 15b side of the semiconductor layer 15. In addition, the resin layer 25 may contain a filler to adjust the flexibility thereof.

Figure 8B:
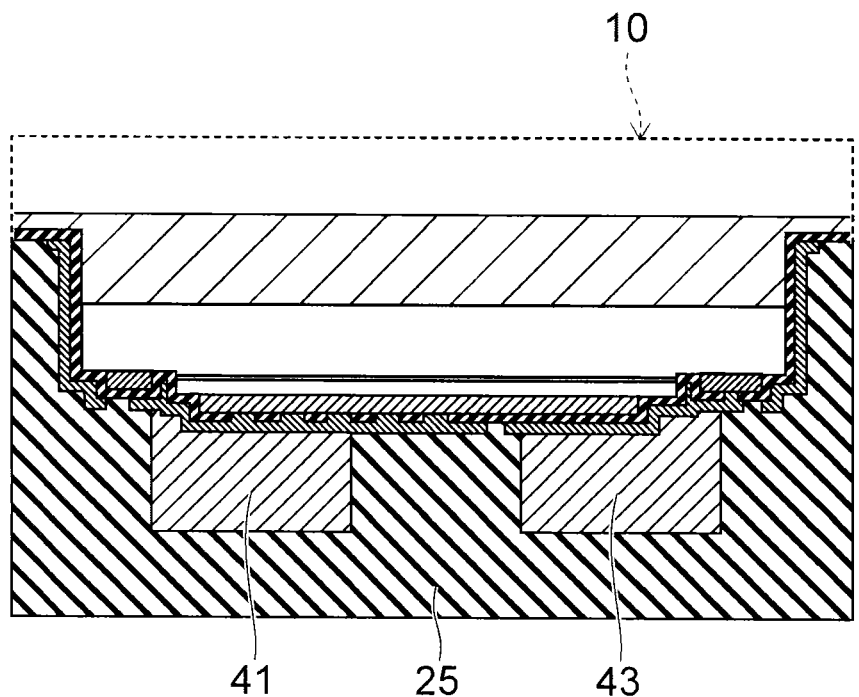
Figure 9A:
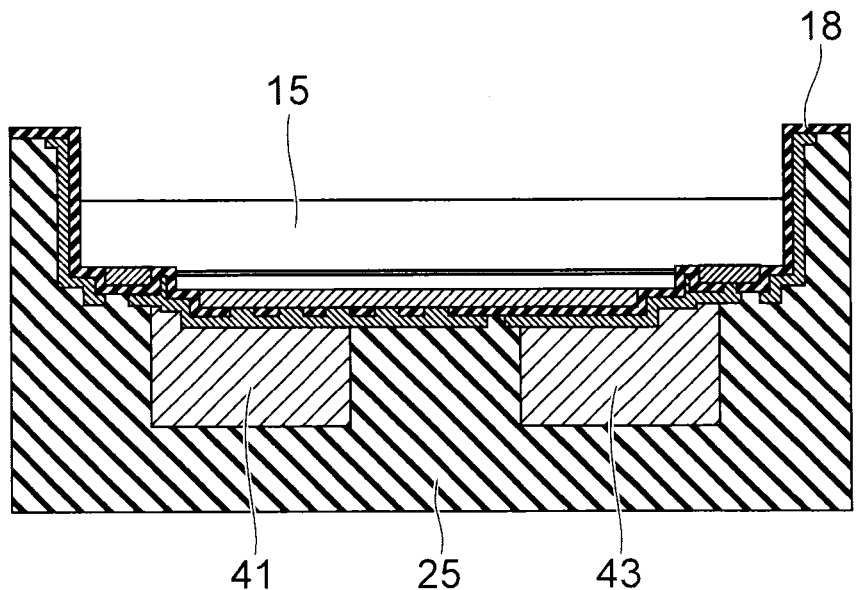

Subsequently, as shown in FIG. 8B, the rear surface side of the substrate 10 is polished to reduce the thickness thereof. As shown in FIG. 9A, the polished thin substrate 10 is removed, for example, using wet etching. Alternatively, the substrate 10 may be removed, for example, using dry etching after the polishing.

After removing the substrate 10, the resin layer 25, the p-side interconnect portion 41, and the n-side interconnect portion 43 support the semiconductor layer 15 to maintain the wafer shape, wherein a plurality of the semiconductor layers 15 are included.

For example, in some cases, the semiconductor layer 15 which is may include a large internal stress, while being epitaxially grown on the substrate 10. When the internal stress during the epitaxial growth is released at the time of removing the substrate 10, the resin layer 25 may absorb the stress as a support body, which is more flexible than the semiconductor layer 15, and prevent the semiconductor layer 15 from destruction.

After removing the substrate 10, the first major surface 15a of the semiconductor layer 15 and the insulating film 18 covering the resin layer 25 are exposed. In addition, fine roughness (not shown) may be preferably formed on the first major surface 15a.

For example, the side of the first major surface 15a of the semiconductor layer 15 is wet-etched using a KOH (potassium hydroxide) solution, TMAH (tetramethylammonium hydroxide), or the like. Due to difference in etching rate depending on orientation of a crystalline plane, the roughness can be formed on the first major surface 15a. The roughness in the first major surface 15a may improve extraction efficiency of the light emitted from the light emitting layer 13 to outward.

Figure 9B:
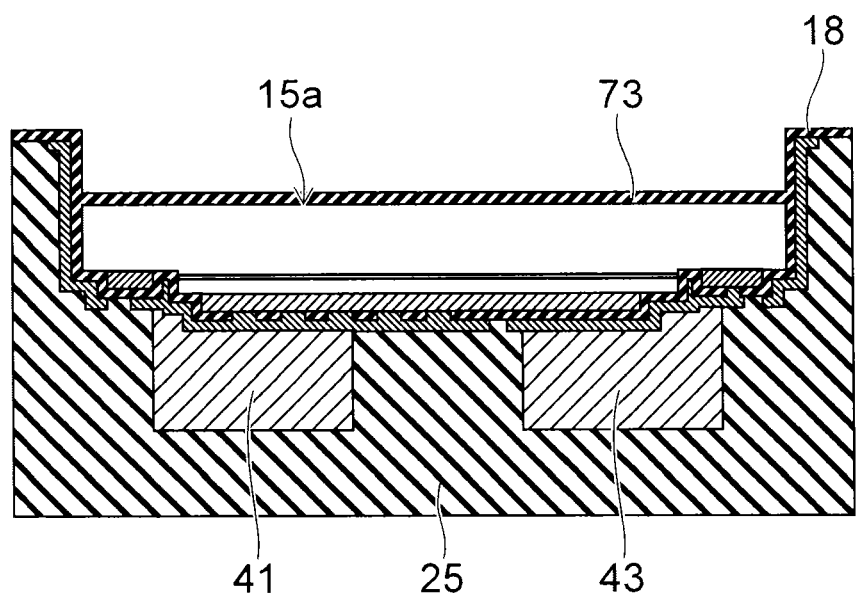

Next, as shown in FIG. 9B, the adhesive layer 73 is formed to cover the first major surface 15a of the semiconductor layer 15 and the insulating film 18. The adhesive layer 73 is, for example, an inorganic film such as a silicon nitride film or a silicon oxide film, and can be formed using a plasma CVD method.

For example, in a case where the insulating film 18 and the adhesive layer 73 are films formed by using the same material, the adhesive layer 73 joins the insulating film 18 to be one film. In the description hereinafter, a portion where the insulating film 18 and the adhesive layer 73 are stacked is described as the insulating film 18.

Figure 10A:
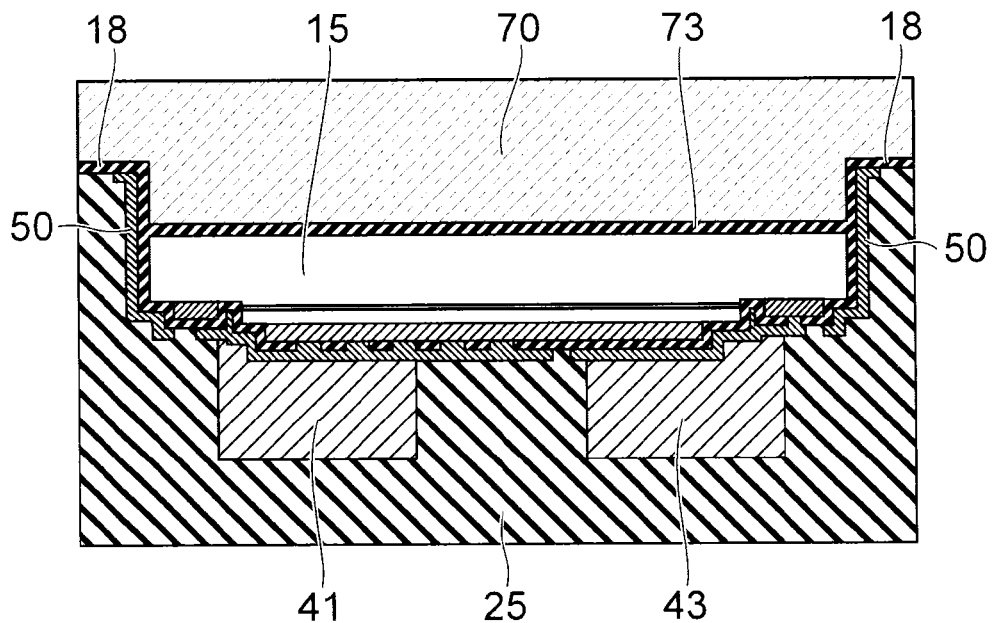

Next, as shown in FIG. 10A, the transparent layer 70 is formed on the adhesive layer 73 and the insulating film 18. The transparent layer 70 is thicker on the adhesive layer 73 (the semiconductor layer 15) than on the insulating film 18. For example, a resin which transmits the light emitted from the light emitting layer 13 and the light radiated from the fluorescent substance 31 is used for the transparent layer 70.

Figure 10B:
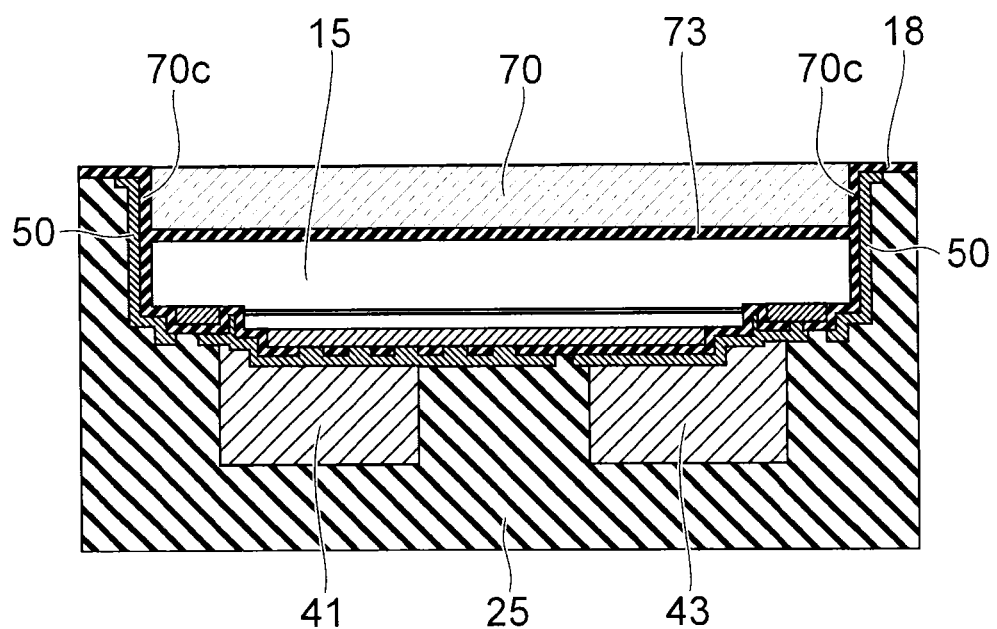

Next, as shown in FIG. 10B, the portion of the transparent layer 70 is removed on the side opposite to the insulating film 18. For example, the transparent layer 70 is polished to be thinner, leaving the portion thereof on the semiconductor layer 15 side. The final thickness of the transparent layer 70 is, for example, several micrometers or several tens micrometers. The side surface 70c of the transparent layer 70 remaining on the semiconductor layer 15 is covered with the metal film 50 via the insulating film 18. The adhesive layer 73 enhances the adhesion strength of the transparent layer 70.

Figure 11A:
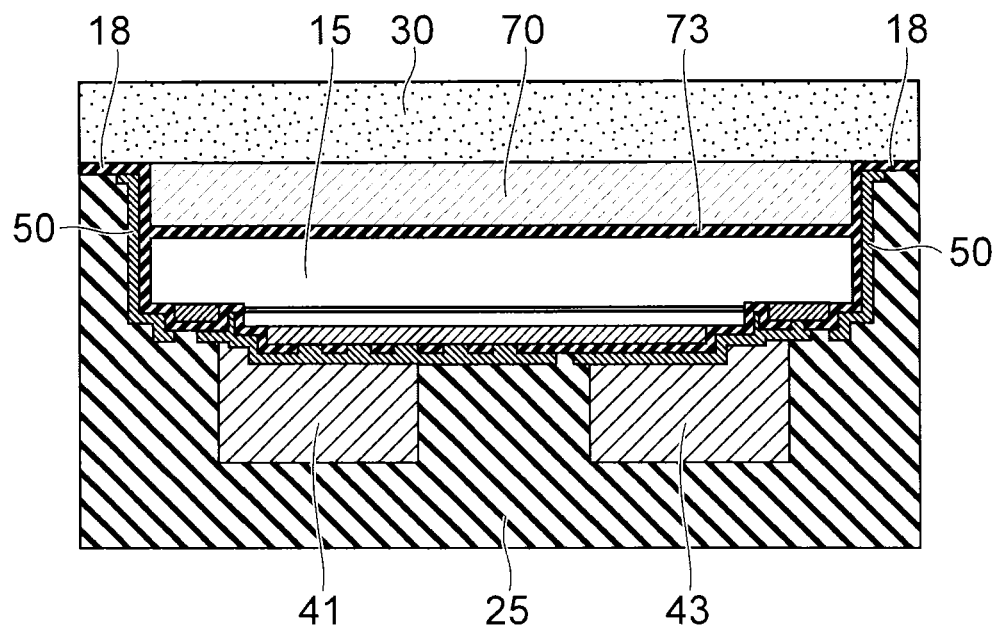

Next, as shown in FIG. 11A, the fluorescent substance layer 30 is formed on the transparent layer 70 and the insulating film 18. The fluorescent substance layer 30 is also formed via the insulating film 18 on the resin layer 25 that surrounds the semiconductor layer 15 and the transparent layer 70. The fluorescent substance layer 30 is, for example, a resin layer including the fluorescent substance 31 and is formed using a method of printing, potting, molding, compression molding, or the like.

In addition, a sintered body of fluorescent substance may be used for the fluorescent substance layer 30, wherein the fluorescent substances 31 are combined with the binder 33 other than the resin. The sintered body is bonded to the semiconductor layer 15 via the transparent layer 70.

Figure 11B:
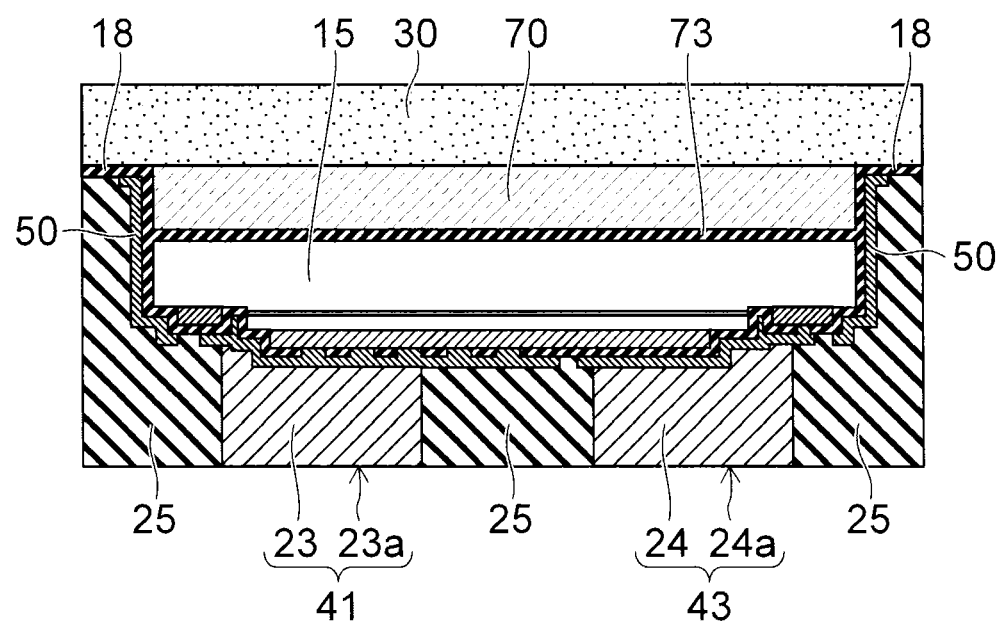

Next, as shown in FIG. 11B, the resin layer 25 is polished to, make the end face of the p-side metal pillar 23 and the end face of the n-side metal pillar 24 exposed. The end face of the p-side metal pillar 23 becomes a p-side external terminal 23a, and the end face of the n-side metal pillar 24 becomes an n-side external terminal 24a. Thus, the resin layer 25 is disposed between the p-side interconnect portion 41 and the n-side interconnect portion 43.

Subsequently, the semiconductor light emitting devices 1 are diced by cutting the fluorescent substance layer 30, the insulating film 18, and the resin layer between the adjacent semiconductor layers 15. The fluorescent substance layer 30, the insulating film 18, and the resin layer 25 can be cut, for example, using a dicing blade or a laser beam. Since there is no part of the semiconductor layer 15 in the dicing area, it is possible to prevent the semiconductor layer 15 from the cutting damage.

The semiconductor light emitting device 1 may have a single-chip structure including at least one semiconductor layer 15 or may have a multiple-chip structure including a plurality of the semiconductor layers 15. The diced semiconductor light emitting device 1 can be directly mounted on the circuit board, since the device is packaged together with the fluorescent substance layer 30. Accordingly, it is possible to reduce production cost. The semiconductor light emitting device 1 is a small-sized light source with a chip-size package that has high versatility.

Next, semiconductor light emitting devices according to variation of the first embodiment will be described with reference to FIGS. 12A to 16.

FIGS. 12A to 16 are schematic cross-sectional views illustrating semiconductor light emitting devices 2 to 9 according to the variation of the first embodiment. Hereinafter, description of the portions including the same component as those of the semiconductor light emitting device 1 will be omitted, and different configurations will be described.

Figure 12A:
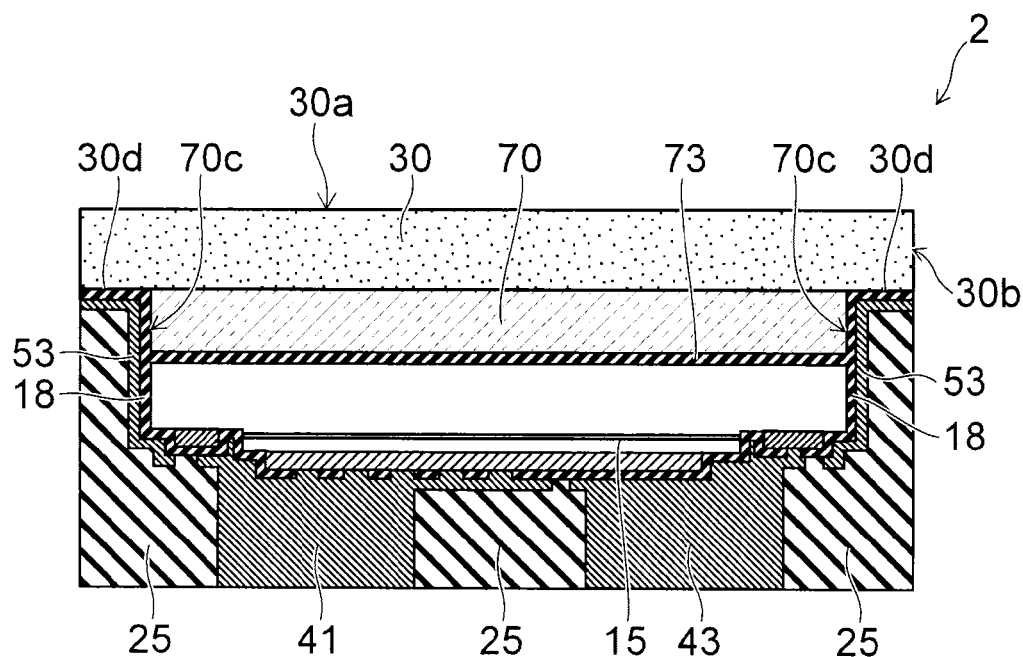
FIGS. 12A to 16 are schematic cross-sectional views showing examples of a semiconductor light emitting device according to a variation of the first embodiment.

The semiconductor light emitting device 2 shown in FIG. 12A includes a metal film 53 which covers the side surface 15c of the semiconductor layer 15 and the side surface 70c of the transparent layer 70. The metal film 53 includes, for example, a reflecting material such as aluminum.

As shown in FIG. 12A, the side surface 70c of the transparent layer 70 is provided to be recessed toward the inner side from an outer edge 70b of the fluorescent substance layer 30. On the transparent layer 70 side of the fluorescent substance layer 30, the metal film 53 (i.e. the reflecting member) covers an outer peripheral portion 30d between the outer edge 30b of the fluorescent substance layer 30 and the side surface 70c.

The metal film 53 reflects light emitted from the light emitting layer 13 and propagating toward the side surface 15c of the semiconductor layer 15, and light emitted from the light emitting layer 13 and propagating through the transparent layer 70 toward the side surface 70c. In the outer peripheral portion 30d of the fluorescent substance layer 30, the light emitted from the light emitting layer 13 and the light radiated from the fluorescent substance 31 are reflected toward the light emitting surface 30a. Accordingly, it is possible to improve the light output of the semiconductor light emitting device 2, and to suppress color unevenness and color breakup in the lateral direction (i.e. the direction parallel to the first major surface 15a).

The metal film 53 is, for example, the underlying metal film 60 (refer to FIG. 6A) and includes the aluminum film 61. The metal film 53 may also be formed using copper plating on the underlying metal film 60. As shown in FIG. 12A, it is preferable to use the underlying metal film 60 without copper plating for the metal film 53, since the semiconductor light emitting devices 2 are cut into dices so that the metal film 53 is exposed in an end face of each dice.

Figure 12B:
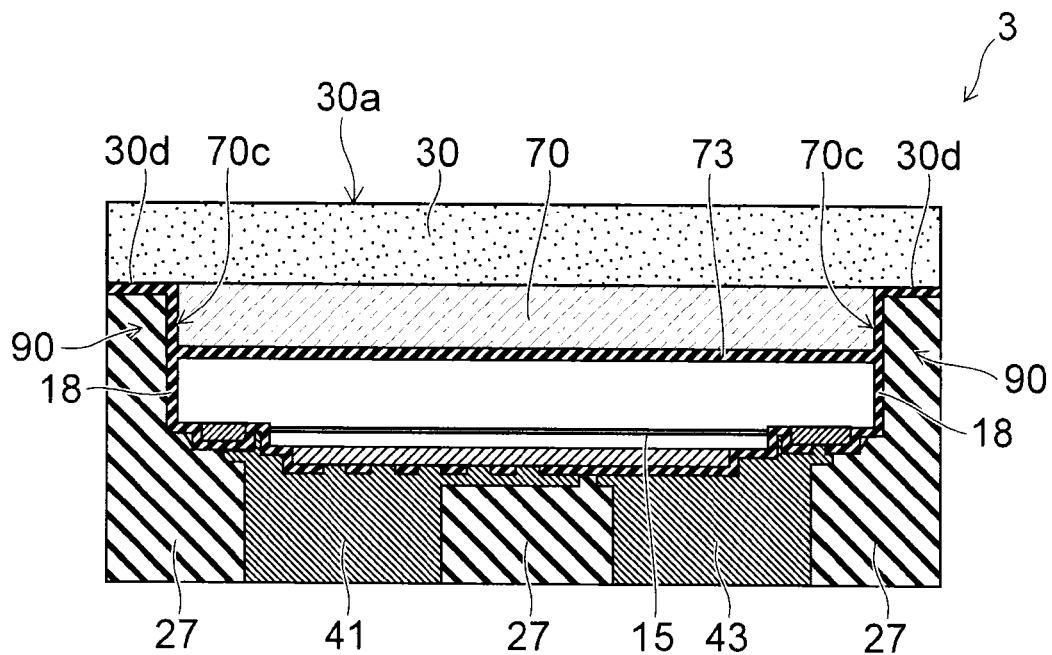

The semiconductor light emitting device 3 shown in FIG. 12B includes a resin layer 27 instead of the resin layer 25. The resin layer 27 is, for example, a white resin including a reflecting material such as a titanium oxide, and reflects the light emitted from the light emitting layer 13 and the light radiated the fluorescent substance 31.

The resin layer 27 fills the inside of the trench 90 surrounding the semiconductor layer 15, and covers the side surface 15c of the semiconductor layer 15 and the side surface 70c of the transparent layer 70 via the insulating film 18. The resin layer 27 reflects the light emitted from the light emitting layer 13, and propagates toward the side surface 15c of the semiconductor layer 15, and the light radiated from the light emitting layer 13, and propagates toward the side surface 70c. In addition, in the outer peripheral portion 30d of the fluorescent substance layer 30, the resin layer 27 reflects the light emitted from the light emitting layer 13 and the light radiated from the fluorescent substance 31. Accordingly, it is possible to improve the light output power of the semiconductor light emitting device 2, and the color unevenness and color breakup in the lateral direction.

On the second major surface 15b side of the semiconductor layer 15, the resin layer covering the p-side interconnect portion 41 and the n-side interconnect portion 43 may has, for example, a two-layered structure that includes the resin layer 27 formed to fill the inside of the trench 90 and the resin layer 25 formed on the resin layer 27.

Figure 13:
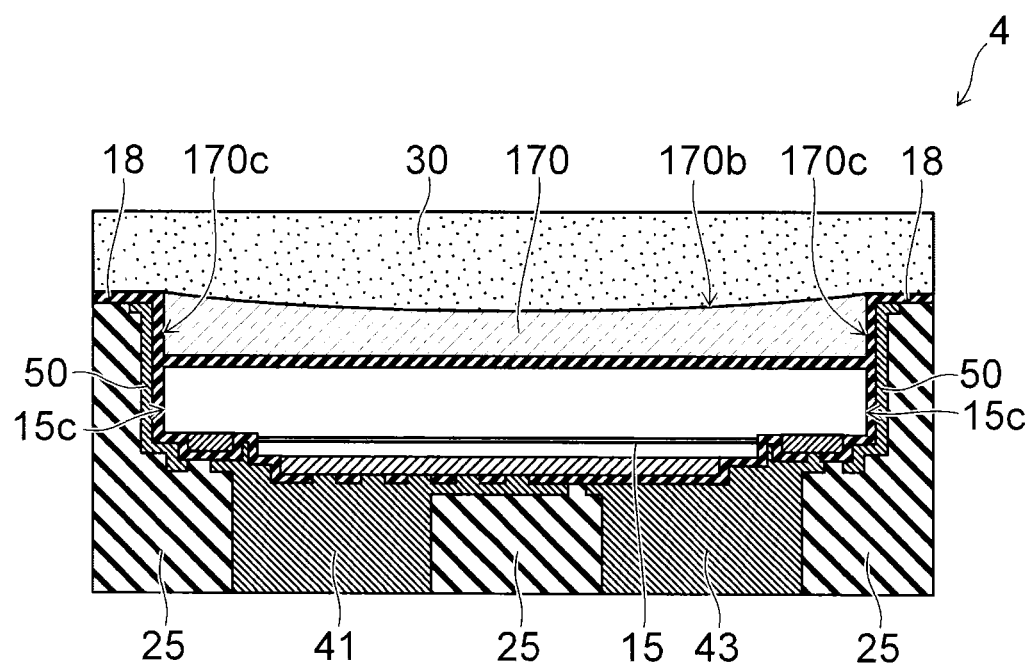

The semiconductor light emitting device 4 shown in FIG. 13 includes a transparent layer 170 between the semiconductor layer 15 and the fluorescent substance layer 30. The transparent layer 170 is formed in a shape, wherein the central portion thereof is thin, and the thickness thereof increases as approaching the side surface 170c. The transparent layer 170 has a concave surface 170b on the fluorescent substance layer 30 side.

The transparent layer 170 having such a shape can be formed, for example, by polishing the transparent layer 70 shown in FIG. 10A. For example, during the polishing process, the central portion thereof becomes thinner than the peripheral portion due to the so-called dishing effect.

The light emitted from the light emitting layer 13 and extracted from the first major surface 15a of the semiconductor layer 15, passes through the transparent layer 170, and is directed toward the fluorescent substance layer 30. The light is scattered in the transparent layer 170. Accordingly, the distribution of the light radiated outward from the fluorescent substance layer 30 may be widened. In addition, the light propagating toward the side surface 15c of the semiconductor layer 15 and the light propagating toward the side surface 170c of the transparent layer 170 are reflected by the metal film 50. In other words, the light emitted from the light emitting layer 13 is suppressed in the lateral direction. Accordingly, in the light distribution characteristics of the semiconductor light emitting device 4, color unevenness, color breakup, and the like can be suppressed in the range of a large orientation angle.

Figure 14A:
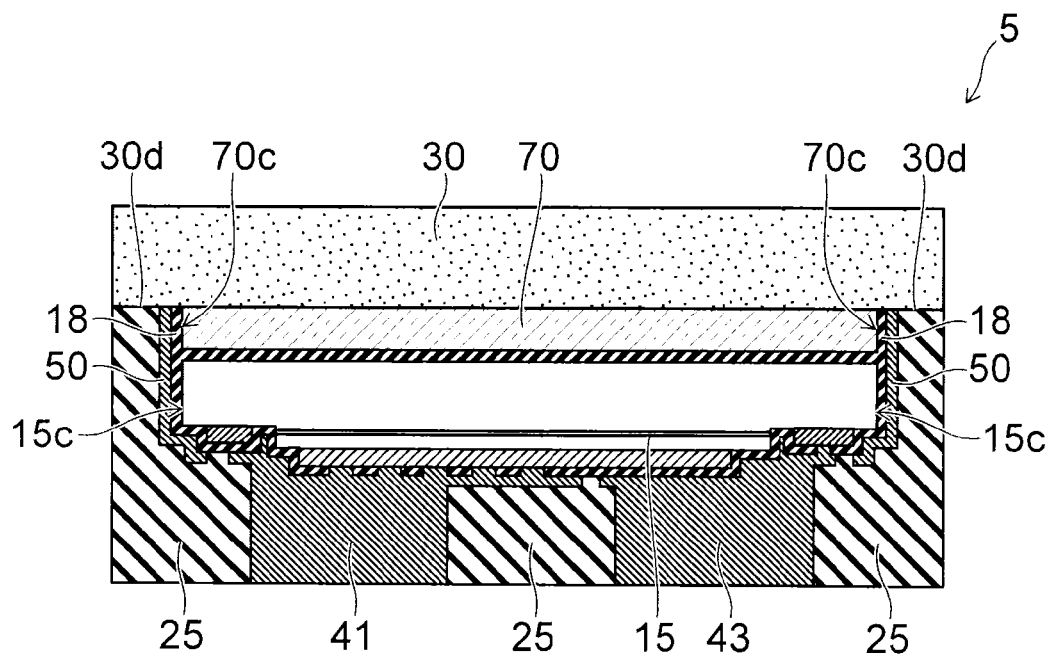

In the semiconductor light emitting device 5 shown in FIG. 14A, the outer peripheral portion 30d of the fluorescent substance layer 30 is in contact with the resin layer 25. In addition, the metal film 50 is in contact with the outer peripheral portion 30d of the fluorescent substance layer 30. This structure can be formed, for example, by removing the insulating film 18 formed on the resin layer 25 when the transparent layer 70 shown in FIG. 10A is polished to be a thinner transparent layer 70. In the polishing process of the transparent layer 70, the thickness thereof can be easily controlled. Thus, it becomes possible to improve the production efficiency of the semiconductor light emitting device 5.

The side surface 70c of the transparent layer 70 is covered with the metal film 50 via the insulating film 18. Accordingly, the metal film 50 reflects the light emitted from the light emitting layer 13 and propagating through the transparent layer 70 in the lateral direction (the direction parallel to the first major surface 15a) toward the side surface 70c.

Figure 14B:
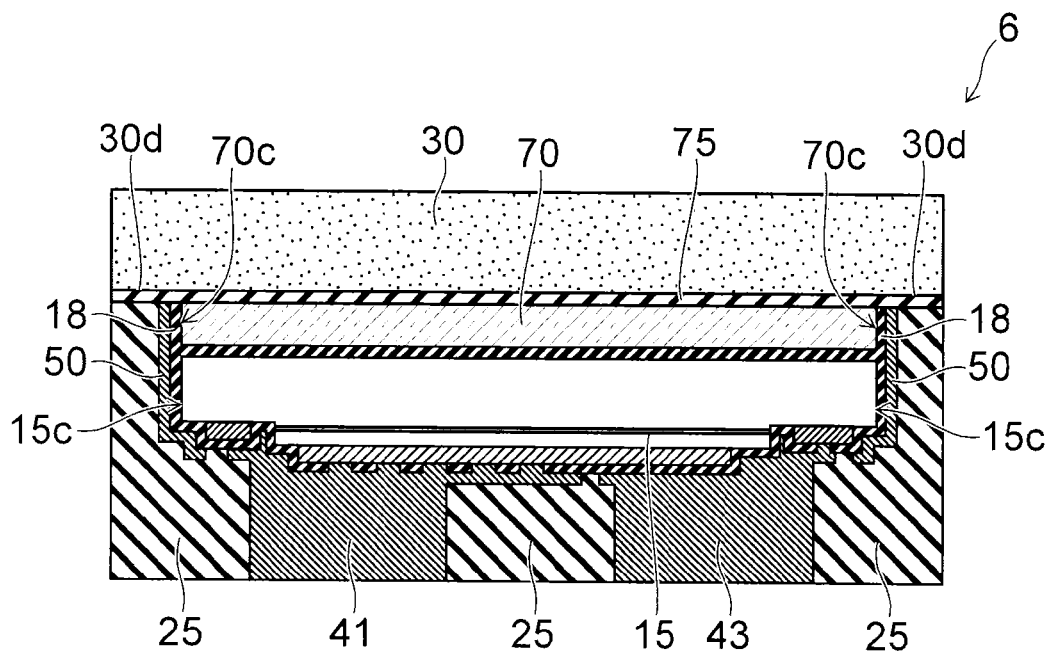

In the semiconductor light emitting device 6 shown in FIG. 14B, an insulating film 75 is provided between the transparent layer 70 and the fluorescent substance layer 30. The insulating film 75 is, for example, an inorganic film such as a silicon oxide film or a silicon nitride film. The thickness of the insulating film 75 is, for example, substantially the same as those of the insulating films 18 and 73.

For example, in the structure shown in FIG. 14A, the insulating film 75 is provided to extend to the outer edge of the fluorescent substance layer 30. Specifically, after the transparent layer 70 shown in FIG. 10A is thinned until the insulating film 18 is removed and the resin layer 25 is exposed, the insulating film 75 is formed to cover the transparent layer 70 and the resin layer 25.

The insulating film 75 enhances, for example, the adhesion strength between the transparent layer 70 and the fluorescent substance layer 30. In addition, the insulating film 75 is interposed between the outer peripheral portion 30d of the fluorescent substance 30 and the resin layer 25 to enhance the adhesion strength therebetween. In other words, the insulating film 75 is effective in a case where the adhesion strength between the transparent layer 70 and the fluorescent substance layer 30 is low. In addition, by enhancing the adhesion strength between the outer peripheral portion 30d of the fluorescent substance layer 30 and the resin layer 25, infiltration of moistures or the like from the outside is suppressed, and thus, reliability can be improved in the semiconductor light emitting device 6.

In the examples shown in FIGS. 14A and 14B, the resin layer 27 including a reflecting material may be used instead of the resin layer 25. Accordingly, the resin layer 27 reflects the light emitted from the light emitting layer 13 and propagating through the fluorescent substance layer 30, and the light radiated from the fluorescent substance 31 in the outer peripheral portion 30d.

Figure 15A:
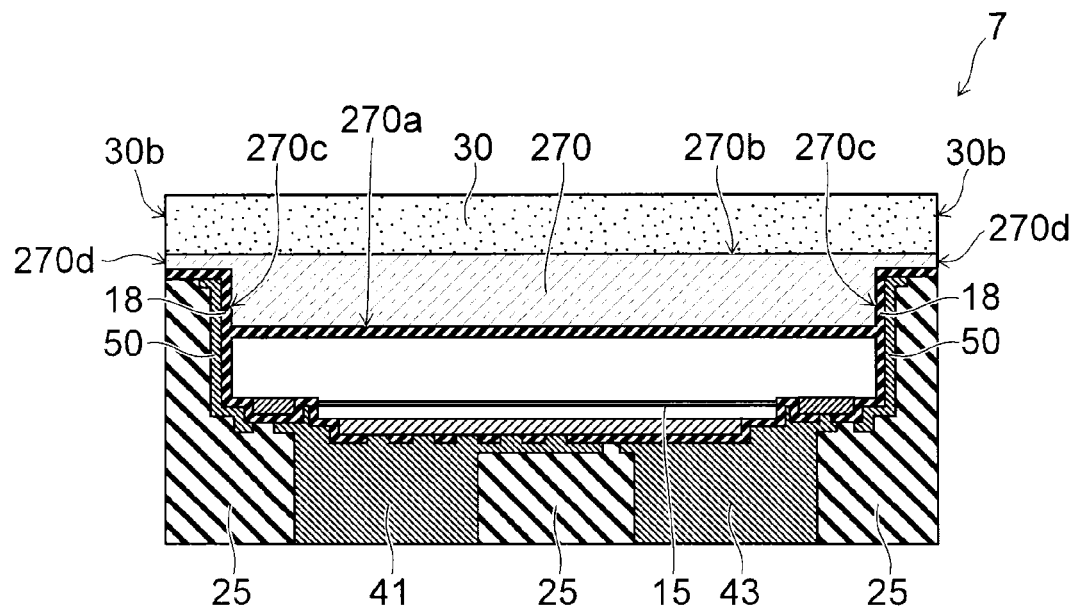

The semiconductor light emitting device 7 shown in FIG. 15A includes a transparent layer 270 between the semiconductor layer 15 and the fluorescent substance layer 30. The transparent layer 270 has a third major surface 270a on the semiconductor layer 15 side and a fourth major surface 270b on a side opposite to the third major surface 270a. An outer edge 270d of the fourth major surface 270b is coincident with the outer edge 30b of the fluorescent substance layer 30.

In the transparent layer 270, a side surface 270c which is in contact with the third major surface 270a is recessed toward the central side from the outer edge 270d. The side surface 270c is covered with the metal film 50 via the insulating film 18. Accordingly, the metal film may reflect the light emitted from the light emitting layer 13, and propagating through the transparent layer 270 in the lateral direction (the direction parallel to the first major surface 15a) toward the side surface 270c.

In the semiconductor light emitting device 7, for example, a portion of the transparent layer 70 remains on the resin layer 25 after polishing the transparent layer 70 shown in FIG. 10A. The thickness can be easily controlled in the process of thinning the transparent layer 70.

Figure 15B:
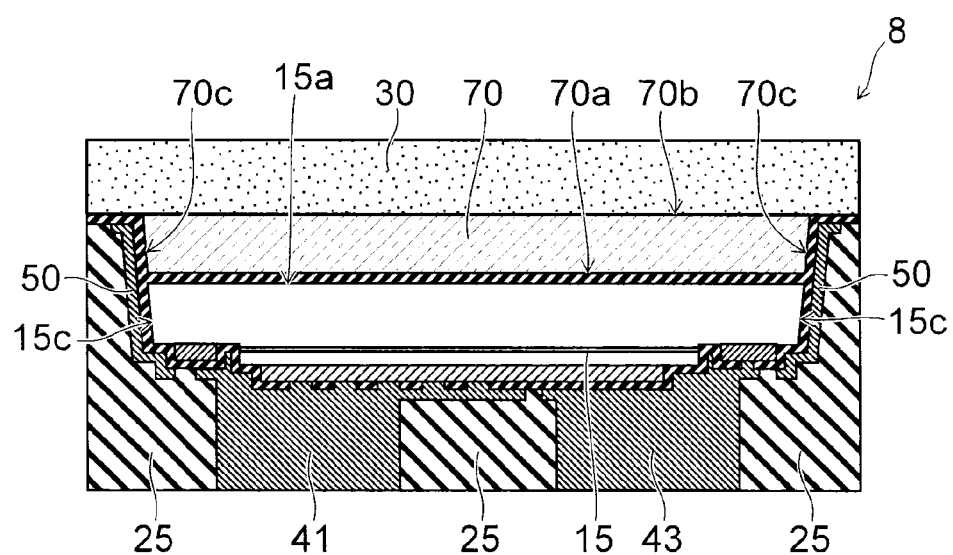

In the semiconductor light emitting device 8 shown in FIG. 15B, the side surface 15c of the semiconductor layer 15 and the side surface 70c of the transparent layer 70 are configured to be inclined. In other words, the semiconductor layer 15 is provided in a shape where the cross sectional area parallel to the first major surface 15a becomes larger as approaching the first major surface 15a. The transparent layer 70 is also provided in a similar shape where the cross sectional area parallel to the third major surface 70a becomes larger as approaching the fluorescent substance layer 30. In other words, the metal film 50 covering the side surface 15c and the side surface 70c is formed so that the inner surface is spread as extending opening in the direction toward the fluorescent substance layer 30.

Accordingly, the metal film 50 may efficiently reflect the light propagating through the semiconductor layer 15 toward the side surface 15c and the light propagating through the transparent layer 70 toward the side surface 70c in the direction toward the fluorescent substance layer 30. In other words, in the semiconductor light emitting device 10, the light radiated in the lateral direction is reduced to suppress the color unevenness and color breakup, and thus, the light output may be improved in the lateral direction.

Figure 16:
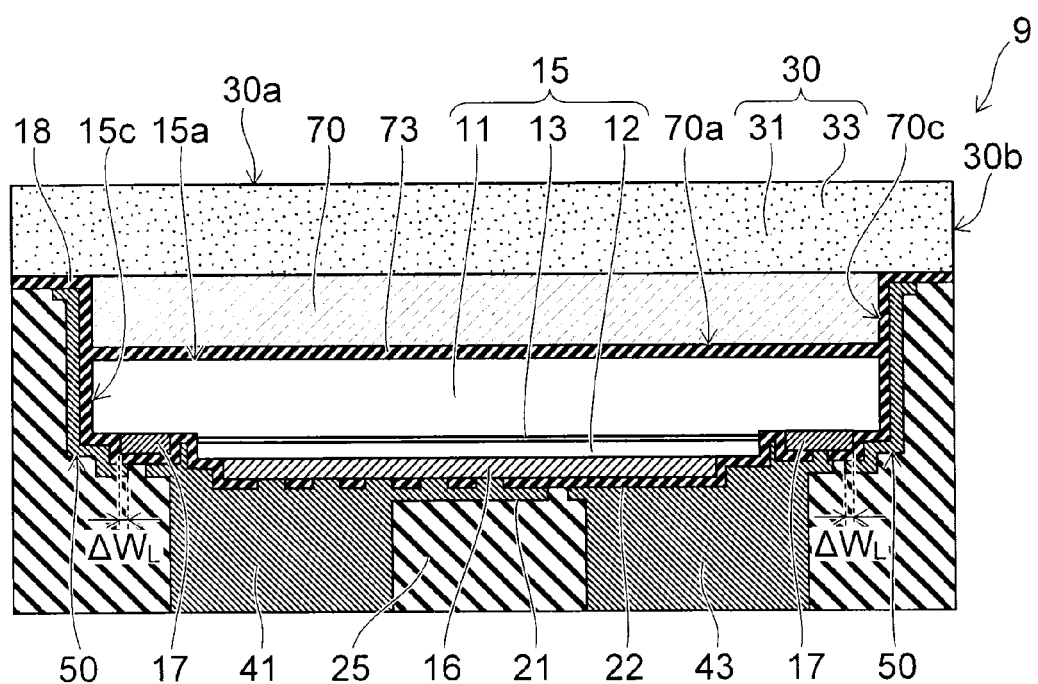

In the semiconductor light emitting device 9 shown in FIG. 16, the metal film 50 is formed to cover an outer edge of the n-side electrode 17 (i.e. the edge on the side surface 15c side). In other words, the metal film 50 is provided to overlap the n-side electrode 17 on the second major surface 15b side. For example, an overlap width AWL of the n-side electrode 17 and the metal film 50 is larger than zero in the entire outer edge of the n-side electrode 17.

In addition, the p-side interconnect portion 41 and the n-side interconnect portion 43 are also provided to cover an inner edge of the n-side electrode 17 (i.e. the edge on the center side of the semiconductor layer 15). Accordingly, the light leakage can be suppressed on the second major surface 15b side. As a result, the light output power can be improved in the semiconductor light emitting device 9, and the resin layer 25 is prevented from degradation caused by the light irradiation, when the light emitting layer 13 emits light in the wavelength range of blue to ultraviolet.

Second Embodiment

A semiconductor light emitting device 10 according to a second embodiment will be described with reference to FIGS. 17 to 20B.

Figure 17:
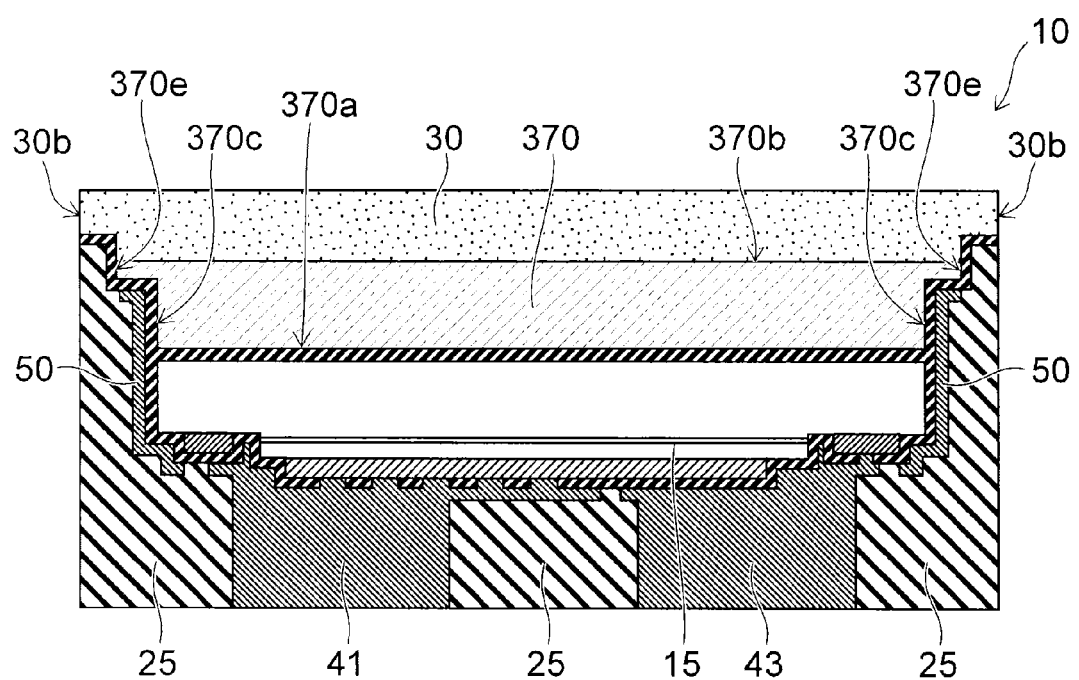
FIG. 17 is a schematic cross-sectional view showing an example of a semiconductor light emitting device according to a second embodiment.

FIG. 17 is a schematic cross-sectional view illustrating the semiconductor light emitting device 10 according to the second embodiment.

FIGS. 18A to 20B are schematic cross-sectional views illustrating processes of manufacturing the semiconductor light emitting device 10 according to the second embodiment. Hereinafter, description of the portions including the same components as those of the semiconductor light emitting device 1 will be omitted, and a portion different therefrom will be described.

As shown in FIG. 17, the semiconductor light emitting device 10 includes a transparent layer 370 provided between the semiconductor layer 15 and the fluorescent substance layer 30. The transparent layer 370 has a third major surface 370a and a fourth major surface 370b at the side opposite to the third major surface 370a. In addition, the transparent layer 370 has a second side surface (hereinafter, referred to as a side surface 370c) which is in contact with the third major surface 370a and a third side surface (hereinafter, referred to as a side surface 370e) which is in contact with the fourth major surface 370b.

The side surface 370e locates between the side surface 370c and the outer edge 30b of the fluorescent substance layer 30. The metal film 50 covers the side surface 15c of the semiconductor layer 15 and the side surface 370c. In addition, the metal film 50 may also cover the side surface 370e.

The metal film 50 reflects the light emitted from the light emitting layer 13 and propagating through the semiconductor layer 15 toward the side surface 15c, and the light emitted from the light emitting layer 13 and propagating through the transparent layer 370 toward the side surface 370c. Accordingly, the light radiated in the lateral direction (the direction parallel to the first major surface 15a) is reduced, thus, improving the color unevenness and color breakup in the lateral direction. In addition, the metal film 50 is formed to cover the side surface 370e so that leakage of the radiation light of the light emitting layer 13 in the lateral direction can be further suppressed.

Next, the processes of manufacturing the semiconductor light emitting device 10 will be described with reference to FIGS. 18A to 20B.

Figure 18A:
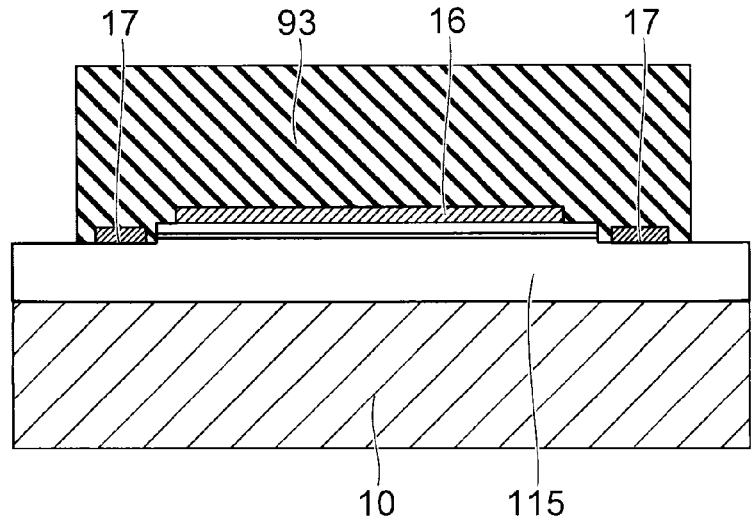
FIGS. 18A to 20B are schematic cross-sectional views showing an example of a manufacturing process of the semiconductor light emitting device according to the second embodiment.

FIG. 18A shows a resist mask 93 formed over the semiconductor layer 115. The resist mask 93 covers the emitting area 15e, the p-side electrode 16, the n-side electrode 17, and a portion of the non-emitting area 15f.

Figure 18B:
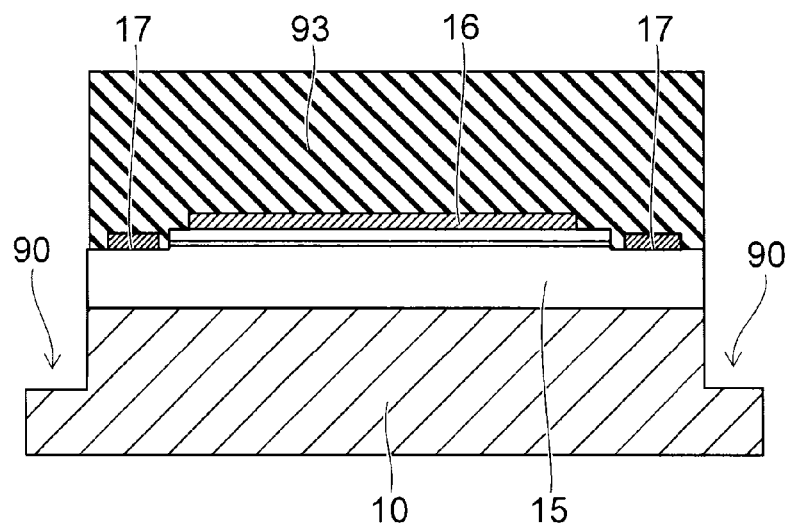
Figure 18C:
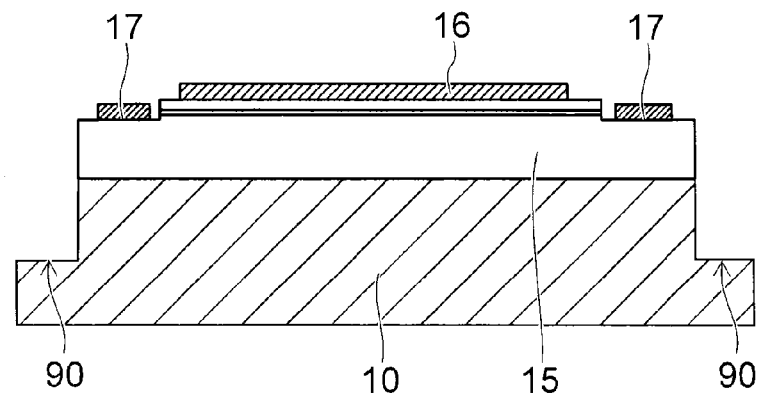

Subsequently, as shown in FIG. 18B, the trench 90 is formed by selectively removing the semiconductor layer 115 using the resist mask 93. The semiconductor layer 115 is divided into a plurality of the semiconductor layers 15 by the trench 90. The trench 90 is formed to reach the substrate 10. In addition, the substrate 10 is also etched to be recessed downward so that a bottom of the trench 90 locates at a level lower than the interface between the substrate 10 and the semiconductor layer 15. The etching depth of the substrate 10 is set to be, for example, several micrometers or several tens micrometers. The resist mask 93 is removed after forming the trench 90, as shown in FIG. 18C.

Figure 19A:
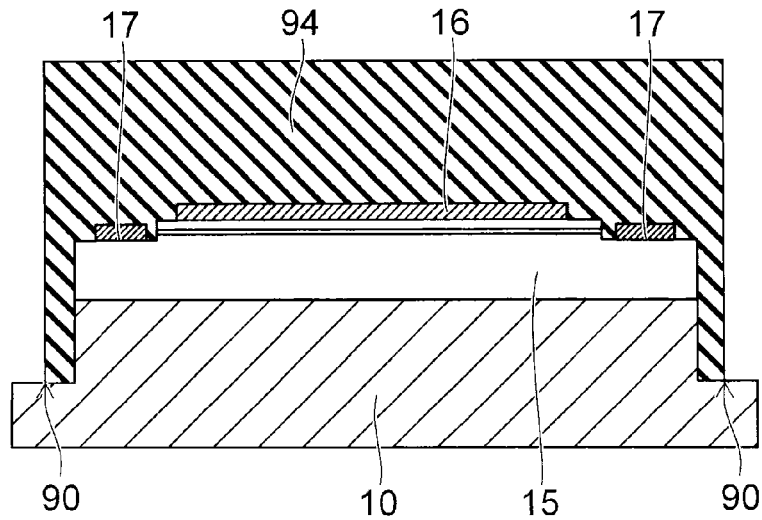

Next, a resist mask 94 is formed as shown in FIG. 19A, which covers the semiconductor layer 15, the p-side electrode 16, the n-side electrode 17, and a portion of the trench 90.

Figure 19B:
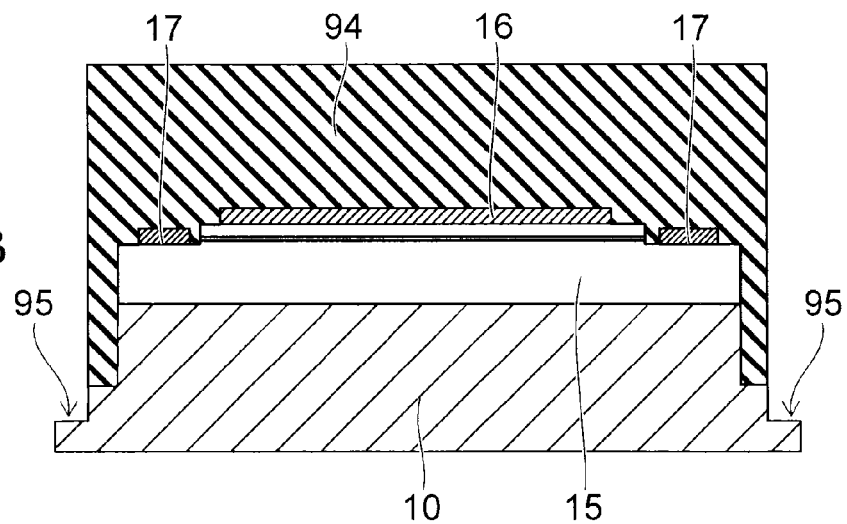
Figure 19C:
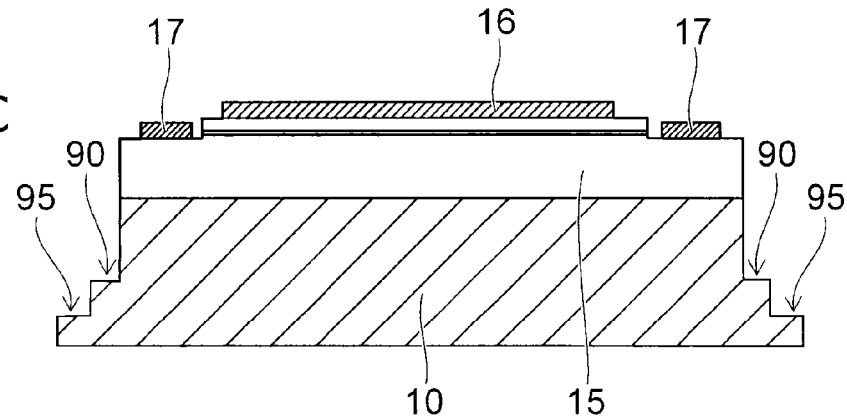

Subsequently, as shown in FIG. 19B, further etching using the resist mask 94 is performed to form a trench 95 in the substrate 10. The trench 95 is formed by selectively digging the bottom of the trench 90. The resist mask 94 is removed as shown in FIG. 19C after forming the trench 95.

Figure 20A:
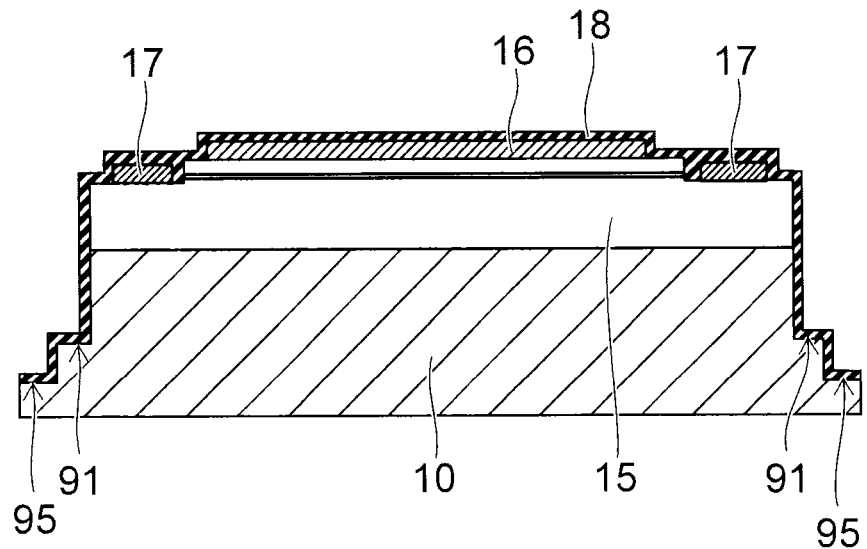

Next, as shown in FIG. 20A, the insulating film 18 is formed, which covers the inner surfaces of the trenches 90 and 95 provided in the substrate 10 and the structure including the semiconductor layer 15 provided on the substrate 10. The insulating film 18, for example, is a silicon oxide film or a silicon nitride film formed using a chemical vapor deposition (CVD) method.

Figure 20B:
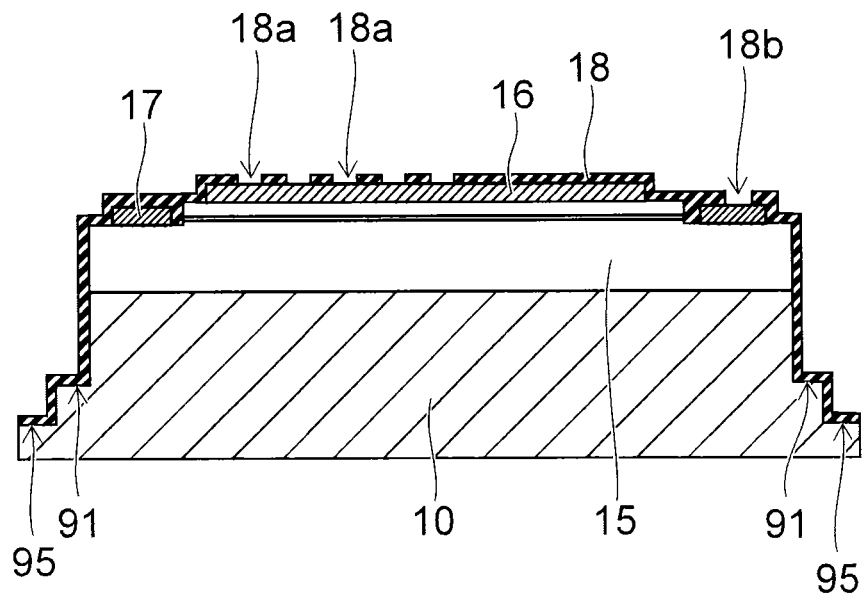

Subsequently, as shown in FIG. 20B, the openings 18a and the opening 18b are formed in the insulating film 18. The openings 18a communicate with the p-side electrode 16, and the opening 18b communicates with the n-side electrode 17. Hereinafter, the semiconductor light emitting device 10 may be completed through the manufacturing processes shown in FIGS. 5B to 11B.

The structures of the semiconductor light emitting devices shown in FIG. 1, FIG. 12A to FIG. 16, and FIG. 17 are not limited to the above-described embodiments. The semiconductor light emitting device may have a structure combining the configurations thereof.

Third Embodiment

Figure 21A:
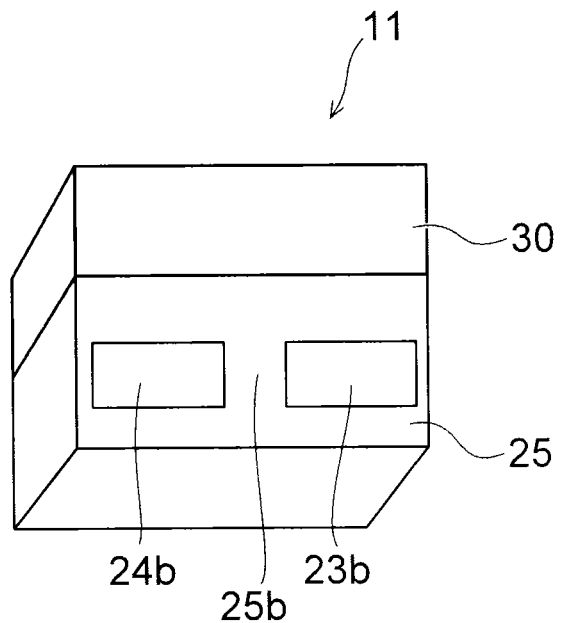
FIGS. 21A and 21B are schematic cross-sectional views showing an example of a semiconductor light emitting device according to a third embodiment.
Figure 21B:
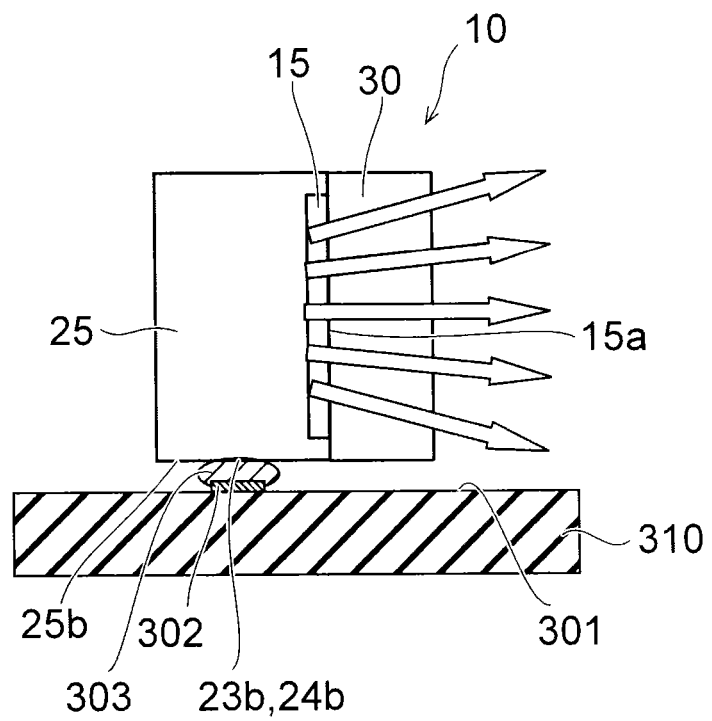

FIGS. 21A and 21B are schematic cross-sectional views illustrating a semiconductor light emitting device 11 according to a third embodiment. The semiconductor light emitting device 11 has a side-view type structure in which external terminals 23b and 24b are provided on the side surface of the resin layer 25. The external terminals 23b and 24b electrically connect the semiconductor light emitting device 11 to the circuit board, for example. The metal pillars 23 and 24 are exposed in a different face of the resin layer 25 from the first and second embodiments. Other configurations are the same as those of the semiconductor light emitting devices 1 to 8.

FIG. 21A is a schematic perspective view showing the semiconductor light emitting device 11.

FIG. 21B is a schematic cross-sectional view of a light emitting module, wherein the semiconductor light emitting device 11 is mounted on a mounting substrate 310.

An end face of the p-side metal pillar 23 is exposed in a fifth surface 25b of the resin layer 25. The fifth surface 25b is different in the surface orientation from the first major surface 15a of the semiconductor layer 15 and the second major surface 15b at the opposite side thereof. The end face of the p-side metal pillar 23 acts as the p-side external terminal 23b for electrically connecting the device to the mounting substrate 310.

For example, the fifth surface 25b is substantially perpendicular to the first major surface 15a and the second major surface 15b of the semiconductor layer 15. The resin layer 25 has, for example, four side surfaces, and one of the side surfaces is the fifth surface 25b.

An end face of the n-side metal pillar 24 is exposed in the fifth surface 25b. The end face of the n-side metal pillar 24 acts as the n-side external terminal 24b for electrically connecting the device to the mounting substrate 310.

In the p-side metal pillar 23, the portion other than the p-side external terminal 23b exposed to the fifth surface 25b is covered with the resin layer 25. In addition, in the n-side metal pillar 24, the portion other than the n-side external terminal 24b exposed to the fifth surface 25b is covered with the resin layer 25.

As shown in FIG. 21B, the semiconductor light emitting device 11 is mounted on the mounting substrate 310 so that the fifth surface 25b faces a mounting surface 301. The p-side external terminal 23b and the n-side external terminal 24b which are exposed to the fifth surface 25b are attached to pads 302 provided on the mounting surface 301 using solder 303. In the mounting substrate 310, a interconnect pattern which is connected to, for example, an external circuit is provided on the mounting surface 301, and the pad 302 is connected to the interconnect pattern.

The fifth surface 25b is substantially perpendicular to the first major surface 15a which is a light emitting surface. Since the fifth surface 25b faces the mounting surface 301, the first major surface 15a is directed in the lateral direction parallel to the mounting surface 301 or in the inclined direction with respect to the mounting surface 301. In other words, the semiconductor light emitting device 11 emits light in the lateral direction parallel to the mounting surface 301 or in the inclined direction with respect to the mounting surface 301.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
    a semiconductor layer having a first major surface, a second major surface on a side opposite to the first major surface, and a first side surface being in contact with the first major surface and the second major surface, the semiconductor layer including a light emitting layer;
    a p-side interconnect portion electrically connected to the semiconductor layer on the second major surface side;
    an n-side interconnect portion electrically connected to the semiconductor layer on the second major surface side;
    a fluorescent substance layer provided on the first major surface side, and including a fluorescent substance radiating light different in a wavelength from light emitted from the light emitting layer;
    a transparent layer provided between the semiconductor layer and the fluorescent substance layer, and having a third major surface on the semiconductor layer side, a fourth major surface on the fluorescent substance layer side, and a second side surface being in contact with the third major surface, the transparent layer transmitting the light emitted from the light emitting layer;
    an insulating film covering the first side surface and the second side surface; and
    a reflecting member covering the first side surface and the second side surface via the insulating film.

2. The device according to claim 1,
    wherein the second side surface is recessed toward an inner side from an outer edge of the fluorescent substance layer;
    the insulating film covers an outer peripheral portion of the fluorescent substance on the transparent layer side of the fluorescent substance layer; and
    the reflecting member extends along the insulating film between the outer edge of the fluorescent substance layer and the second side surface.

3. The device according to claim 2, wherein the reflecting member extends to the outer edge of the fluorescent substance layer.

4. The device according to claim 1,
    wherein the transparent layer has a third side surface being in contact with the fourth major surface; and
    the third side surface locates between the second side surface and an outer edge of the fluorescent substance layer.

5. The device according to claim 4, wherein the insulating film covers the third side surface.

6. The device according to claim 1, further comprising a resin layer covering the first side surface, the second side surface, and an outer peripheral portion of the fluorescent substance.

7. The device according to claim 6, wherein the resin layer includes a member reflecting the light emitted from the light emitting layer.

8. The device according to claim 6, wherein the reflecting member is provided between the insulating film and the resin layer.

9. The device according to claim 6, wherein the insulating layer is provided between the fluorescent substance layer and the resin layer in the outer peripheral portion of the fluorescent substance layer.

10. The device according to claim 6, further comprising another insulating film between the transparent layer and the fluorescent substance layer, the another insulating film being made of inorganic material,
    wherein the another insulating film has a portion provided between the fluorescent substance layer and the resin layer in the outer peripheral portion of the fluorescent substance layer.

11. The device according to claim 6,
    wherein the resin layer further covers the second major surface side of the semiconductor layer; and
    each of the p-side interconnect portion and the n-side interconnect portion has an end face exposed in a surface of the resin layer opposite to the semiconductor layer.

12. The device according to claim 1, wherein the transparent layer has an extension portion extending in a direction from the second side surface to an outer edge of the fluorescent substance layer.

13. The device according to claim 12,
    wherein the extension portion of the transparent layer reaches the outer edge of the fluorescent substance layer; and
    an outer edge of the extension portion is coincident with the outer edge of the fluorescent substance layer.

14. The device according to claim 12, wherein the insulating film covers the extension portion.

15. The device according to claim 12, wherein the reflecting member covers at least a portion of the extension portion on a side opposite to the fluorescent substance layer.

16. The device according to claim 1, wherein the transparent layer is provided in a shape where the transparent layer becomes thicker as approaching the second side surface.

17. The device according to claim 1, wherein at least a portion of the reflecting member is a resin including a reflecting material which reflects the light emitted from the light emitting layer.

18. The device according to claim 1, wherein a cross sectional area of the semiconductor layer parallel to the first major surface becomes larger as approaching the first major surface.

19. The device according to claim 18, wherein a cross sectional area of the transparent layer parallel to the third major surface becomes larger as approaching toward the fluorescent substance layer.

20. The device according to claim 1, further comprising:
a first electrode in contact with the semiconductor layer; and
a second electrode in contact with the semiconductor layer,
wherein the semiconductor layer includes an emitting region and an non-emitting region; and
the first electrode is in contact with the emitting region, and the second electrode is in contact with the non-emitting region,
wherein the p-side interconnect portion is electrically connected to one of the first electrode and the second electrode; and
the n-side interconnect portion is electrically connected to the other of the first electrode and the second electrode,
wherein the reflecting member covers at least part of the first electrode or the second electrode.

* * * * *